(12) United States Patent
Niida et al.

(10) Patent No.: US 12,105,420 B2
(45) Date of Patent: *Oct. 1, 2024

(54) COATING-TYPE COMPOSITION FOR FORMING ORGANIC FILM, PATTERNING PROCESS, POLYMER, AND METHOD FOR MANUFACTURING POLYMER

(71) Applicant: SHIN-ETSU CHEMICAL CO., LTD., Tokyo (JP)

(72) Inventors: Keisuke Niida, Joetsu (JP); Daisuke Kori, Joetsu (JP); Yasuyuki Yamamoto, Joetsu (JP); Takayoshi Nakahara, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 701 days.

This patent is subject to a terminal disclaimer.

(21) Appl. No.: 17/183,989

(22) Filed: Feb. 24, 2021

(65) Prior Publication Data
US 2021/0278766 A1    Sep. 9, 2021

(30) Foreign Application Priority Data
Mar. 5, 2020    (JP) .................................. 2020-38165

(51) Int. Cl.
*G03F 7/09*      (2006.01)
*C08G 61/10*      (2006.01)
(Continued)

(52) U.S. Cl.
CPC ............. *G03F 7/094* (2013.01); *C08G 61/10* (2013.01); *C08L 65/00* (2013.01); *C09D 165/00* (2013.01);
(Continued)

(58) Field of Classification Search
CPC . G03F 7/094; G03F 7/09; G03F 7/004; G03F 7/11; C08G 2261/1414; C08G 2261/3142
See application file for complete search history.

(56) References Cited

U.S. PATENT DOCUMENTS 8,685,620 B2 *   4/2014    Takaki .................... G03F 7/039
                                                                                                      430/270.1
2002/0106909 A1    8/2002    Kato et al.
(Continued)

FOREIGN PATENT DOCUMENTS

CN      110317125 A    10/2019
CN      111913352 A    11/2020
(Continued)

OTHER PUBLICATIONS

Translated Description from Hatakeyama (Year: 2010).*
(Continued)

*Primary Examiner* — Sean M DeGuire
*Assistant Examiner* — Andrew Preston Traywick
(74) *Attorney, Agent, or Firm* — Oliff PLC

(57) ABSTRACT

The present invention provides a coating-type composition for forming an organic film containing: a polymer having a structure shown by the following general formula (1) as a partial structure; and an organic solvent, where in the formula (1), ring structures Ar1 and Ar2 represent a benzene ring or a naphthalene ring optionally having a substituent, and $W_1$ represents an aryl group having 6 to 30 carbon atoms and optionally having a substituent. This provides a coating-type composition for forming an organic film that can form an organic film having high pattern-curving resistance and high dry-etching resistance, the composition being excellent in solvent solubility and having a low generation of defects.

(Continued)

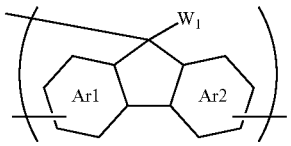

21 Claims, 1 Drawing Sheet

(51) Int. Cl.
*C08L 65/00* (2006.01)
*C09D 165/00* (2006.01)
*G03F 7/00* (2006.01)
*G03F 7/11* (2006.01)
*H01L 21/027* (2006.01)

(52) U.S. Cl.
CPC ............ *G03F 7/11* (2013.01); *H01L 21/0276* (2013.01); *C08G 2261/11* (2013.01); *C08G 2261/124* (2013.01); *C08G 2261/1414* (2013.01); *C08G 2261/1422* (2013.01); *C08G 2261/1424* (2013.01); *C08G 2261/148* (2013.01); *C08G 2261/149* (2013.01); *C08G 2261/18* (2013.01); *C08G 2261/228* (2013.01); *C08G 2261/3142* (2013.01); *G03F 7/0002* (2013.01)

(56) References Cited

U.S. PATENT DOCUMENTS

| | | | |
|---|---|---|---|
| 2005/0255712 | A1 | 11/2005 | Kato et al. |
| 2006/0019195 | A1 | 1/2006 | Hatakeyama et al. |
| 2006/0204891 | A1 | 9/2006 | Jatakeyama |
| 2009/0274978 | A1 | 11/2009 | Ohashi et al. |
| 2010/0099044 | A1 | 4/2010 | Hatakeyama et al. |
| 2013/0105440 | A1* | 5/2013 | Lu .............................. G03F 7/09 430/270.1 |
| 2013/0115555 | A1* | 5/2013 | Shimizu ................ C08F 226/06 430/284.1 |
| 2013/0302990 | A1 | 11/2013 | Watanabe et al. |
| 2014/0246400 | A1 | 9/2014 | Tigashihara et al. |
| 2016/0005595 | A1* | 1/2016 | Liu ..................... H01L 21/0276 |
| 2016/0077438 | A1* | 3/2016 | Brust ........................ G03F 7/40 |
| 2018/0030200 | A1* | 2/2018 | Otani ..................... C08G 61/12 |
| 2019/0064659 | A1 | 2/2019 | Kori et al. |
| 2019/0196073 | A1* | 2/2019 | Samejima ......... H01L 31/02162 |
| 2019/0300498 | A1 | 10/2019 | Tachibana et al. |
| 2020/0356007 | A1* | 11/2020 | Kori ......................... G03F 7/11 430/311 |
| 2020/0363723 | A1 | 11/2020 | Kori et al. |
| 2023/0244147 | A1* | 8/2023 | Kori ........................ G03F 7/094 |
| 2023/0260787 | A1* | 8/2023 | Niida .................. H01L 21/0276 |

FOREIGN PATENT DOCUMENTS

| | | |
|---|---|---|
| CN | 111948903 A | 11/2020 |
| EP | 3 550 362 A1 | 10/2019 |
| EP | 3 739 387 A1 | 11/2020 |
| EP | 3 739 388 A1 | 11/2020 |
| JP | 2002-334869 A | 11/2002 |
| JP | 2004-205685 A | 7/2004 |
| JP | 2005-128509 A | 5/2005 |
| JP | 2005-250434 A | 9/2005 |
| JP | 2006-227391 A | 8/2006 |
| JP | 2006-285095 A | 10/2006 |
| JP | 2006-293298 A | 10/2006 |
| JP | 2007-199653 A | 8/2007 |
| JP | 2008-158002 A | 7/2008 |
| JP | 2009-269953 A | 11/2009 |
| JP | 2010-122656 A | 6/2010 |
| JP | 2010271654 A * | 12/2010 ............. C08G 61/10 |
| JP | 2013-253227 A | 12/2013 |
| JP | 6094947 B2 | 3/2017 |
| JP | 2019-172605 A | 10/2019 |
| KR | 10-2018-0071892 A | 6/2018 |
| WO | 2004/066377 A1 | 8/2004 |
| WO | WO2018117562 A1 * | 6/2018 ........... C07D 213/06 |

OTHER PUBLICATIONS

Translated Claims from Hatakeyama (Year: 2010).*
Translated Description from Son (Year: 2018).*
Translated Claims from Son (Year: 2018).*
Wikipedia.org; diethylene glycol dimethyl ether boiling point (Year: 2023).*
Pubchem.ncbi.nlm.nih.gov; 1-ethoxy-2-propanol boiling point (Year: 2023).*
Dec. 22, 2021 Office Action issued in Taiwanese Patent Application No. 110107416.
Jan. 4, 2023 Office Action issued in Japanese Patent Application No. 2020-038165.
Oct. 8, 2021 Office Action issued in Taiwanese Patent Application No. 110107416.
Oct. 8, 2021 Search Report issued in Taiwanese Patent Application No. 110107416.
Aug. 2, 2021 Search Report issued in European Patent Application No. 21160789.0.
Nov. 28, 2022 Office Action issued in Korean Patent Application No. 2021-0028613.
J. Abe et al.; "Sub-55-nm Etch Process Using Stacked-Mask Process"; Dry Process International Symposium; 2005; pp. 11-12.
Apr. 10, 2024 Office Action and Search Report issued in Chinese Patent Application No. 202110240480.9.

* cited by examiner

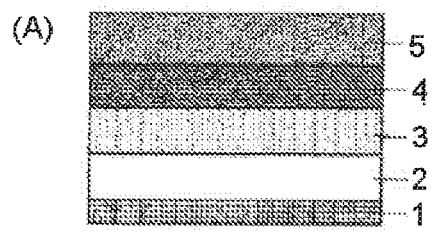
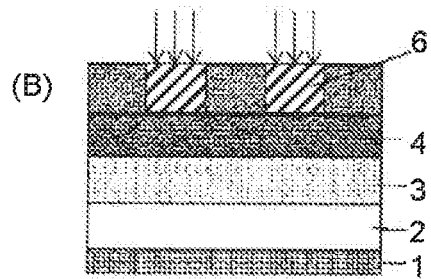
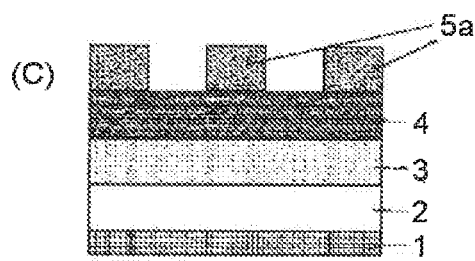
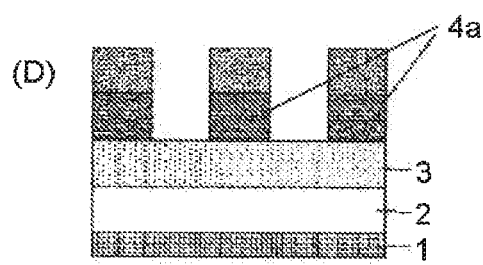
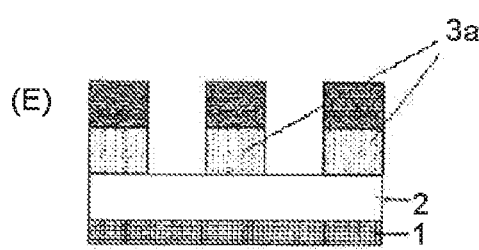
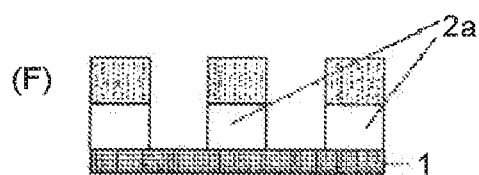

COATING-TYPE COMPOSITION FOR FORMING ORGANIC FILM, PATTERNING PROCESS, POLYMER, AND METHOD FOR MANUFACTURING POLYMER

TECHNICAL FIELD

The present invention relates to: a coating-type composition for forming an organic film; a patterning process using the composition; a polymer contained in the composition; and a method for manufacturing the polymer.

BACKGROUND ART

Recently, along with advancements toward higher integration and higher speed in LSI, a finer pattern rule has been required. In this situation, various techniques have been developed in regard to how patterning process can be performed more finely and precisely with light sources used in lithography with light exposure, which is a commonly-employed technique at present.

Due to such processing line width reduction, phenomena have been reported in which an organic film is twisted and/or curved when a substrate to be processed is dry-etched while using a hard mask mainly containing carbon as a mask (Non Patent Document 1). When such a hard mask is an amorphous carbon (hereinafter CVD-C) film prepared by CVD or ALD, the amount of hydrogen atoms in the film can be reduced quite small, and this film is generally well known to be very effective in preventing the twisting.

Nevertheless, when a substrate to be processed has a step(s), if the substrate to be processed is subjected to the subsequent patterning process by lithography in the presence of the step(s), the process margin such as depth of focus in the lithography process becomes insufficient. For this reason, the step(s) of the substrate need to be planarized with an organic film. Planarizing the substrate to be processed by using an organic film suppresses fluctuation in film thickness of a resist underlayer film and a photoresist upper layer film formed thereon, increases the depth of focus in lithography, and can increase the process margin.

Meanwhile, the CVD-C film using a methane gas, an ethane gas, or an acetylene gas, or the like as the raw material is an excellent film for forming an organic film having a uniform thickness on a substrate. However, in the case where the substrate has a step(s) thereon, if film thickness does not vary according to the depth of the step to be processed, an organic film having a flat surface cannot be formed. Hence, such a CVD-C film is not suitable as a means for planarizing a stepped substrate.

In such a case, when an organic film is formed by spin-coating a material for forming an organic film containing an organic resin, there are advantages not only that the organic film material can fill a step(s) of the substrate, but also that the substrate surface can be planarized. However, although such an organic film has been conventionally utilized as an organic hard mask and an organic film in a multilayer resist process, the anti-twisting property is insufficient in forming a fine pattern in comparison with a CVD-C film since an organic matter is used as the base material. Hence, there are demands for an organic resin for an organic underlayer film having filling and planarizing properties as an organic hard mask and also having twisting resistance equivalent to a CVD-C film.

Meanwhile, as conventional technology, Patent Document 1 discloses a fluorene compound having high heat resistance. However, a resin manufactured by this technology has a low solubility, and has a high risk of generating defects. Accordingly, there are demands to raise solvent solubility while maintaining high twisting resistance.

CITATION LIST

Patent Literature

Patent Document 1: JP 6094947 B

Non Patent Literature

Non Patent Document 1: Proc. Of Symp. Dry. Process, (2005) p11

SUMMARY OF INVENTION

Technical Problem

An object of the present invention is to provide: a coating-type composition for forming an organic film that can form an organic film having high pattern-curving resistance and high dry-etching resistance, the composition being excellent in solvent solubility and having a low generation of defects; a patterning process using the composition; a polymer contained in the composition; and a method for manufacturing the polymer.

Solution to Problem

To achieve the object, the present invention provides a coating-type composition for forming an organic film comprising: a polymer having a structure shown by the following general formula (1) as a partial structure; and an organic solvent,

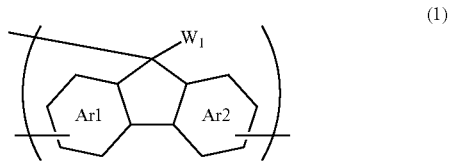

(1)

wherein in the formula (1), ring structures Ar1 and Ar2 represent a benzene ring or a naphthalene ring optionally having a substituent, and $W_1$ represents an aryl group having 6 to 30 carbon atoms and optionally having a substituent.

When such a partial structure is introduced into a main skeleton, the coating film is formed with a condensed aromatic ring structure having high etching resistance, and an organic film having high pattern-curving resistance and high dry-etching resistance can be formed. In particular, the above-described coating-type composition for forming an organic film enables formation of an organic film that prevents a high-aspect line pattern finer than 40 nm from line collapse and twisting after dry etching by containing the above-described polymer, and a coating film excellent particularly in in-plane uniformity of the coating film can be formed.

In addition, in the structure shown by the formula (1), the carbon atom in the top position of the fluorene ring is bonded to the aryl group $W_1$. Therefore, the carbon atom in the top position of the fluorene ring in one repeating unit shown by the formula (1) is bonded to another repeating unit, is bonded to a crosslinking group, or is bonded to a terminal group. That is, the carbon atom in the top position of the fluorene ring in the repeating unit shown by the formula (1) has one attachment point to another atom or atomic group not shown in the formula (1). The specific reason is unclear, but a polymer having a structure shown by such a formula (1) as a partial structure can exhibit a solvent solubility more excellent than the solvent solubility of a polymer whose carbon atom in the top position of the fluorene skeleton has two polymerization points, and generation of defects can be suppressed. In addition, since solvent solubility is high, an organic film that can exhibit excellent filling property and planarizing property can be formed. Meanwhile, an organic film formed by using the inventive coating-type composition for forming an organic film containing the polymer having the structure shown by the formula (1) as a partial structure can exhibit sufficient solvent resistance through a heat treatment.

The present invention further provides a coating-type composition for forming an organic film comprising: a polymer having a partial structure shown by the following general formula (2); and an organic solvent,

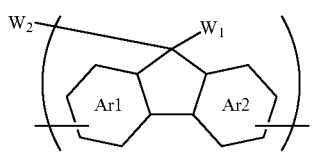

(2)

wherein in the formula (2), ring structures Ar1 and Ar2 represent a benzene ring or a naphthalene ring optionally having a substituent, $W_1$ represents an aryl group having 6 to 30 carbon atoms and optionally having a substituent, $W_2$ represents an organic group having at least one aromatic ring, a hydroxy group, or an alkyloxy group having 1 to 10 carbon atoms, $W_2$ is optionally a part of a repeating unit, and when $W_2$ is the organic group, the organic group $W_2$ is optionally crosslinked to another repeating unit.

When such a partial structure is introduced into a main skeleton, the coating film is formed with a condensed aromatic ring structure having high etching resistance, and an organic film having high pattern-curving resistance and high dry etching resistance can be formed. In particular, the above-described coating-type composition for forming an organic film enables formation of an organic film that prevents a high-aspect line pattern finer than 40 nm from line collapse and twisting after dry etching by containing the above-described polymer, and a coating film excellent particularly in in-plane uniformity of the coating film can be formed. In addition, when $W_2$ is introduced, the solvent solubility of this coating-type composition for forming an organic film can be adjusted, and required properties such as etching resistance and filling and planarizing properties of an organic film obtained by using this coating-type composition for forming an organic film can be adjusted.

Furthermore, in the structure shown by the formula (2), the carbon atom in the top position of the fluorene ring is bonded to the aryl group $W_1$, and $W_2$, being the organic group, hydroxy group, or alkyloxy group. Therefore, the carbon atom in the top position of the fluorene ring in one repeating unit shown by the formula (2) has no attachment points to another atom or atomic group not shown in the formula (2). Molecular weight can be adjusted by introducing the $W_2$, and thus solvent solubility can be raised. As a result, a polymer having a partial structure shown by such a formula (2) can exhibit a solvent solubility more excellent than the solvent solubility of a polymer whose carbon atom in the top position of the fluorene skeleton has two polymerization points, and generation of defects can be suppressed. In addition, since solvent solubility is high, an organic film that can exhibit excellent filling property and planarizing property can be formed. Meanwhile, an organic film formed by using the inventive coating-type composition for forming an organic film containing the polymer having the partial structure shown by the formula (2) can exhibit sufficient solvent resistance through a heat treatment.

In the formula (2), the $W_2$ is further preferably the organic group, and contains a nitrogen atom.

A composition containing such a favorable polymer can not only improve solvent solubility, but also enables formation of an organic film that further prevents a high-aspect line pattern finer than 40 nm from twisting after dry etching, although the specific reason is unclear.

Furthermore, the polymer having the partial structure shown by the formula (1) or formula (2) preferably comprises a partial structure shown by the following general formula (3),

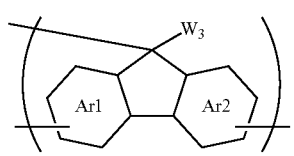

(3)

wherein in the formula (3), ring structures Ar1 and Ar2 are the above ring structures Ar1 and Ar2, and $W_3$ represents a hydrogen atom.

Furthermore, when an organic film formed from the composition for forming an organic film containing the polymer having the partial structure shown by the general formula (3) is heated, a crosslinking reaction takes place by a coupling reaction accompanied by the dehydrogenation of hydrogen atoms in the trityl position of the fluorene ring.

The polymer preferably has a weight-average molecular weight of 500 to 5000.

When a composition for forming an organic film contains a polymer having a weight-average molecular weight within such a range, outgas at baking can be suppressed without a loss in solubility in an organic solvent.

The organic solvent is preferably a mixture of one or more organic solvents each having a boiling point of lower than 160° C. and one or more organic solvents each having a boiling point of 160° C. or higher.

When the organic solvent is such a mixture, the polymer is provided with thermal flowability of an organic film by addition of a high-boiling-point solvent so that the composition for forming an organic film is given both higher filling and planarizing properties.

The coating-type composition for forming an organic film preferably further comprises at least one of an acid generator, a crosslinking agent, a surfactant, and a plasticizer.

A composition for forming an organic film containing such additives can be given more excellent coating property and filling and planarizing properties.

The present invention provides a patterning process comprising:

forming an organic film by using the inventive composition for forming an organic film on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

A fine pattern can be formed on the substrate to be processed with high precision by the patterning process according to the 3-layer resist process. In particular, in the above-described patterning process, the organic film is formed by using the inventive coating-type composition for forming an organic film, and therefore, an organic film having high pattern-curving resistance and high dry-etching resistance can be formed while suppressing generation of defects.

Furthermore, the present invention provides a patterning process comprising: forming an organic film by using the inventive coating-type composition for forming an organic film on a body to be processed;
forming a silicon-containing resist underlayer film by using a silicon-containing resist underlayer film material on the organic film;
forming an organic antireflective coating (BARC) on the silicon-containing resist underlayer film;
forming a resist upper layer film by using a photoresist composition on the organic antireflective coating so that a 4-layered film structure is constructed;
forming a circuit pattern in the resist upper layer film;
transferring the pattern to the organic antireflective coating and the silicon-containing resist underlayer film by etching the organic antireflective coating and the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

A fine pattern can be formed on the substrate to be processed with even higher precision by the patterning process according to the 4-layer resist process. In particular, in the above-described patterning process, the organic film is formed by using the inventive coating-type composition for forming an organic film, and therefore, an organic film having high pattern-curving resistance and high dry-etching resistance can be formed while suppressing generation of defects.

Furthermore, the present invention provides a patterning process comprising:
forming an organic film by using the inventive coating-type composition for forming an organic film on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching the inorganic hard mask while using the resist upper layer film having the formed pattern as a mask;
transferring the pattern to the organic film by etching the organic film while using the inorganic hard mask having the transferred pattern as a mask; and
further forming the pattern on the body to be processed by etching the body to be processed while using the organic film having the transferred pattern as a mask.

A fine pattern can be formed on the substrate to be processed with high precision by the patterning process according to this 3-layer resist process. In particular, in the above-described patterning process, the organic film is formed by using the inventive coating-type composition for forming an organic film, and therefore, an organic film having high pattern-curving resistance and high dry-etching resistance can be formed while suppressing generation of defects.

Furthermore, the present invention provides a patterning process comprising:
forming an organic film by using the inventive coating-type composition for forming an organic film on a body to be processed;
forming an inorganic hard mask selected from a silicon oxide film, a silicon nitride film, and a silicon oxynitride film on the organic film;
forming an organic antireflective coating on the inorganic hard mask;
forming a resist upper layer film by using a photoresist composition on the organic antireflective coating, so that a 4-layered film structure is constructed;
forming a circuit pattern in the resist upper layer film;
transferring the pattern to the organic antireflective coating and the inorganic hard mask by etching the organic antireflective coating and the inorganic hard mask while using the resist upper layer film having the formed pattern as a mask;
transferring the pattern to the organic film by etching the organic film while using the inorganic hard mask having the formed pattern as a mask; and
further forming the pattern on the body to be processed by etching the body to be processed while using the organic film having the formed pattern as a mask.

A fine pattern can be formed on the substrate to be processed with higher precision by the patterning process according to this 4-layer resist process. In particular, in this patterning process, the organic film is formed by using the inventive coating-type composition for forming an organic film, and therefore, an organic film having high pattern-curving resistance and high dry-etching resistance can be formed while suppressing generation of defects.

The inorganic hard mask is preferably formed by a CVD method or an ALD method.

When the inorganic hard mask is formed by a CVD method or an ALD method, a fine pattern can be formed on the substrate to be processed with higher precision.

As a method for forming the circuit pattern on the resist upper layer film, a photolithography using light with a wavelength of 10 nm or more to 300 nm or less, a direct drawing by electron beam, a nanoimprinting, or a combination thereof is preferably employed.

When the above methods are employed as the method for forming a circuit pattern on the resist upper layer film, a fine pattern can be formed on the substrate to be processed with higher precision.

The pattern formation on the resist upper layer film preferably comprises alkaline development or development with an organic solvent.

When alkaline development or development with an organic solvent is employed as a development method, a fine pattern can be formed on the substrate to be processed with higher precision.

As the body to be processed, a semiconductor device substrate, a metal film, a metal carbide film, a metal oxide film, a metal nitride film, a metal oxycarbide film, or a metal oxynitride film is preferably used.

In the present invention, those described above can be used as the body to be processed, for example.

The body to be processed preferably comprises silicon, titanium, tungsten, hafnium, zirconium, chromium, germanium, copper, silver, gold, aluminum, indium, gallium, arsenic, palladium, iron, tantalum, iridium, molybdenum, or an alloy thereof.

These can be used as the metal.

Furthermore, the present invention provides a polymer having a partial structure shown by the following general formula (1),

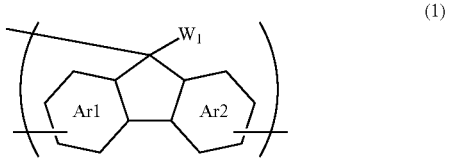

(1)

wherein in the formula (1), ring structures Ar1 and Ar2 represent a benzene ring or a naphthalene ring optionally having a substituent, and $W_1$ represents an aryl group having 6 to 30 carbon atoms and optionally having a substituent.

This polymer allows an organic film formed from a condensed aromatic ring structure having high etching resistance, and is therefore a component that provides a composition for forming an organic film that enables formation of an organic film having high pattern-curving resistance and high dry-etching resistance. In particular, using this polymer enables formation of an organic film that prevents a high-aspect line pattern finer than 40 nm from line collapse and twisting after dry etching, and a coating film excellent particularly in in-plane uniformity of the coating film can be formed.

In addition, as described above, the carbon atom in the top position of the fluorene ring in the repeating unit shown by the formula (1) has one attachment point to another atom or atomic group not shown in the formula (1). The specific reason is unclear, but the inventive polymer having a structure shown by such a formula (1) as a partial structure can exhibit a solvent solubility more excellent than a polymer whose carbon atom in the top position of the fluorene skeleton has two polymerization points, and generation of defects can be suppressed. In addition, since solvent solubility is high, an organic film that can exhibit excellent filling property and planarizing property can be formed. Mean-while, a polymer having the structure shown by the formula (1) as a partial structure can exhibit sufficient solvent resistance through a heat treatment.

Furthermore, the present invention provides a polymer having a partial structure shown by the following general formula (2),

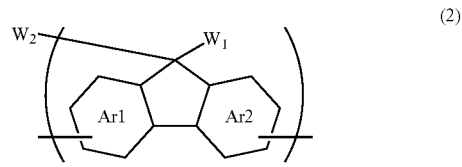

(2)

wherein in the formula (2), ring structures Ar1 and Ar2 represent a benzene ring or a naphthalene ring optionally having a substituent, $W_1$ represents an aryl group having 6 to 30 carbon atoms and optionally having a substituent, $W_2$ represents an organic group having at least one aromatic ring, a hydroxy group, or an alkyloxy group having 1 to 10 carbon atoms, $W_2$ is optionally a part of a repeating unit, and when $W_2$ is the organic group, the organic group $W_2$ is optionally crosslinked to another repeating unit.

This polymer allows an organic film formed from a condensed aromatic ring structure having high etching resistance, and is therefore a component that provides a composition for forming an organic film that enables formation of an organic film having high pattern-curving resistance and high dry-etching resistance. In particular, using this polymer enables formation of an organic film that prevents a high-aspect line pattern finer than 40 nm from line collapse and twisting after dry etching, and a coating film excellent particularly in in-plane uniformity of the coating film can be formed. In addition, when a partial structure as in this polymer is introduced into the main skeleton, the solvent solubility of the polymer can be adjusted. This allows a component that provides a composition for forming an organic film that enables formation of an organic film having the required properties adjusted such as etching resistance and filling and planarizing properties of the organic film formed using this polymer.

In addition, as described above, the carbon atom in the top position of the fluorene ring in one repeating unit shown by the formula (2) has no attachment points to another atom or atomic group not shown in the formula (2). The specific reason is unclear, but a polymer having a partial structure shown by such a formula (2) can exhibit a solvent solubility more excellent than a polymer whose carbon atom in the top position of the fluorene skeleton has two polymerization points, and generation of defects can be suppressed. In addition, since solvent solubility is high, an organic film that can exhibit excellent filling property and planarizing property can be formed. Meanwhile, a polymer having the partial structure shown by the formula (2) can exhibit sufficient solvent resistance through a heat treatment.

In the formula (2), the $W_2$ is further preferably the organic group, and contains a nitrogen atom.

When such a favorable polymer is used, it is not only possible to improve solvent solubility, but also to form an organic film that prevents a high-aspect line pattern finer than 40 nm from twisting after dry etching, although the specific reason is unclear.

The polymer having the partial structure shown by the formula (1) or formula (2) preferably further comprises a partial structure shown by the following general formula (3),

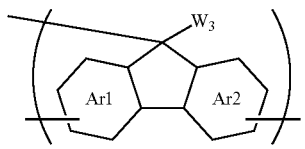

(3)

wherein in the formula (3), ring structures Ar1 and Ar2 are the above ring structures Ar1 and Ar2, and $W_3$ represents a hydrogen atom.

When the polymer further contains the partial structure, a component that provides a composition for forming an organic film that enables formation of an organic film having higher curving resistance and also having higher dry-etching resistance is possible.

The polymer preferably has a weight-average molecular weight of 500 to 5000.

When a composition for forming an organic film contains a polymer having a weight-average molecular weight within such a range, outgas at baking can be suppressed without a loss in solubility in an organic solvent.

Furthermore, the present invention provides a method for manufacturing the polymer having the partial structure shown by the general formula (1), wherein
the polymer is synthesized by an electrophilic substitution reaction to a fluorene ring accompanied by dehydration while using a fluorenol having the aryl group $W_1$ and a tertiary alcohol group as a monomer.

A polymer having the partial structure shown by the general formula (1) can be manufactured according to this manufacturing method.

Furthermore, the present invention provides a method for manufacturing the polymer having the partial structure shown by the general formula (2), wherein
the $W_2$ represents the organic group, and
the polymer is synthesized by copolymerizing a fluorenol having the aryl group $W_1$ and a tertiary alcohol group and a compound having the organic group $W_2$ as a partial structure.

According to this manufacturing method, a polymer having the partial structure shown by the general formula (2) where the $W_2$ represents the organic group can be manufactured.

Furthermore, the present invention provides a method for manufacturing the polymer having the partial structure shown by the general formula (2), wherein
the $W_2$ represents the organic group,
the polymer is synthesized by an electrophilic substitution reaction to a fluorene ring accompanied by dehydration while using a fluorenol having the aryl group W; and a tertiary alcohol group as a monomer, and
a compound having the organic group $W_2$ as a partial structure is added during the synthesizing of the polymer.

According to this manufacturing method, a polymer having the partial structure shown by the general formula (2) where the $W_2$ represents the organic group can be manufactured.

Furthermore, the present invention provides a method for manufacturing the polymer having the partial structure shown by the general formula (2), wherein the $W_2$ represents a hydroxy group or an alkyloxy group having 1 to 10 carbon atoms,
the polymer is synthesized by an electrophilic substitution reaction to a fluorene ring accompanied by dehydration while using a fluorenol having the aryl group $W_1$ and a tertiary alcohol group as a monomer, and
water or alcohol is added beforehand into a reaction system before the synthesizing or during reaction.

According to this manufacturing method, a polymer having the partial structure shown by the general formula (2) where the $W_2$ represents a hydroxy group or an alkyloxy group having 1 to 10 carbon atoms can be manufactured.

Furthermore, the present invention provides a method for manufacturing the polymer having the partial structure shown by the general formula (3), wherein
a fluorenol having the aryl group $W_1$ and a tertiary alcohol group and a fluorenol having a secondary alcohol group are copolymerized.

A polymer having the partial structure shown by the general formula (3) can be manufactured according to this manufacturing method.

Furthermore, the present invention provides a method for manufacturing the polymer having the partial structure shown by the general formula (3), wherein
the polymer is synthesized by an electrophilic substitution reaction to a fluorene ring accompanied by dehydration while using one of a first fluorenol having the aryl group $W_1$ and a tertiary alcohol group or a second fluorenol having a secondary alcohol group as a monomer to obtain a first polymer, and
another of the first fluorenol and the second fluorenol is added to the first polymer and further polymerized to obtain the polymer having the partial structure shown by the general formula (3) as a second polymer.

A polymer having the partial structure shown by the general formula (3) can be manufactured according to this manufacturing method.

Advantageous Effects of Invention

As described above, the inventive coating-type composition for forming an organic film enables formation of an organic film having high dry-etching resistance, and in particular, enables formation of an organic film that prevents a high-aspect line pattern finer than 40 nm from line collapse and twisting after dry etching. In addition, the risk of defects being generated can be reduced by raising the solvent solubility of the polymer. Therefore, the inventive coating-type composition for forming an organic film enables formation of a useful and excellent organic film that is applied in the manufacturing process of a semiconductor device. Furthermore, the inventive polymer is an optimum component for the above-described composition.

BRIEF DESCRIPTION OF DRAWINGS

FIG. 1 is an explanatory diagram of an example of a 3-layer resist method according to an inventive patterning process.

DESCRIPTION OF EMBODIMENTS

Hereinafter, the present invention will be described in detail. However, the present invention is not limited thereto.

<Polymer>

The present invention is a polymer having a structure shown by the following general formula (1) as a partial structure.

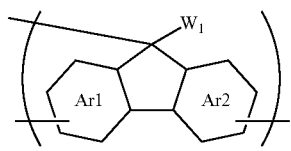

(1)

(In the formula (1), ring structures Ar1 and Ar2 represent a benzene ring or a naphthalene ring optionally having a substituent, and $W_1$ represents an aryl group having 6 to 30 carbon atoms and optionally having a substituent. Note that the ring structures Ar1 and Ar2 may be the same, or may be different from each other.)

When such a partial structure is introduced into a main skeleton, the coating film is formed with a condensed aromatic ring structure having high etching resistance, and an organic film having high pattern-curving resistance and high dry-etching resistance can be formed. When the above-described polymer is contained, an organic film formed by using the inventive polymer can become a coating film that can suppress a high-aspect line pattern finer than 40 nm from line collapse and twisting after dry etching, in particular, and that is also excellent in in-plane uniformity.

In addition, in the structure shown by the formula (1), the carbon atom in the top position of the fluorene ring is bonded to the aryl group $W_1$. Therefore, the carbon atom in the top position of the fluorene ring in one repeating unit shown by the formula (1) is bonded to another repeating unit, is bonded to a crosslinking group, or is bonded to a terminal group. That is, the carbon atom in the top position of the fluorene ring in the repeating unit shown by the formula (1) has one attachment point to another atom or atomic group not shown in the formula (1). The specific reason is unclear, but a polymer having a structure shown by such a formula (1) as a partial structure can exhibit a solvent solubility more excellent than the solvent solubility of a polymer whose carbon atom in the top position of the fluorene skeleton has two polymerization points, and generation of defects can be suppressed. In addition, since solvent solubility is high, an organic film that can exhibit excellent filling property and planarizing property can be formed. Meanwhile, an organic film formed by using the polymer having the structure shown by the formula (1) as a partial structure can exhibit sufficient solvent resistance through a heat treatment.

Examples of the partial structure constituted from Ar1 and Ar2 of the polymer in the general formula (1) include the following. The aromatic rings thereof may have a substituent such as a vinyl group, an ethynyl group, an ethynylphenyl group, an allyl group, a propargyl group, an aryl group, an allyloxy group, and a propargyloxy group thereon. Out of the following, the fluorene and benzofluorene structures are preferable in view of availability of raw materials.

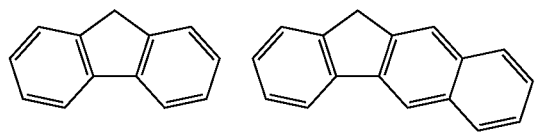

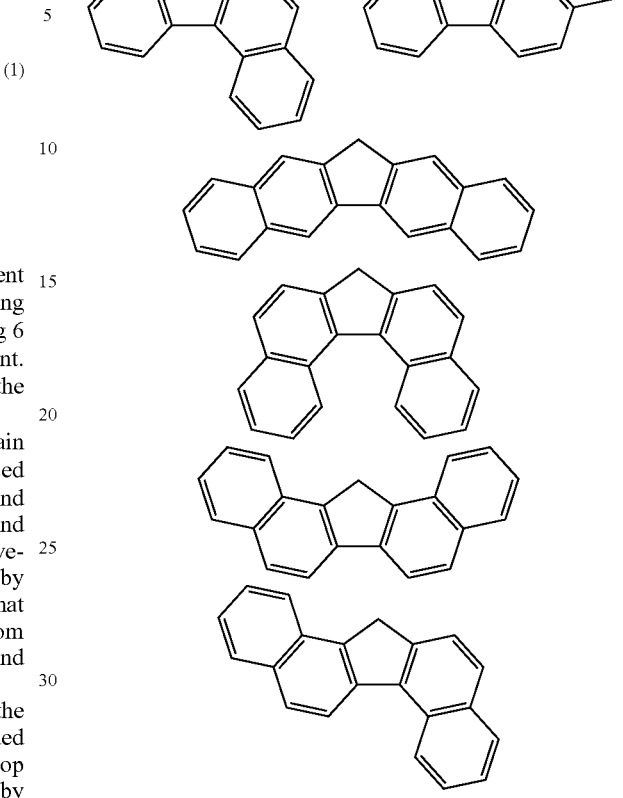

In addition, the present invention is a polymer having a partial structure shown by the following general formula (2).

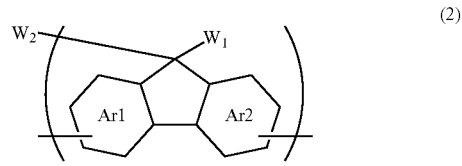

(2)

(In the formula (2), ring structures Ar1 and Ar2 represent a benzene ring or a naphthalene ring optionally having a substituent, $W_1$ represents an aryl group having 6 to 30 carbon atoms and optionally having a substituent, $W_2$ represents an organic group having at least one aromatic ring, a hydroxy group, or an alkyloxy group having 1 to 10 carbon atoms, $W_2$ is optionally a part of a repeating unit, and when $W_2$ is the organic group, the organic group $W_2$ is optionally crosslinked to another repeating unit. Note that the ring structures Ar1 and Ar2 may be the same, or may be different from each other.)

When such a partial structure is introduced into a main skeleton, the coating film is formed with a condensed aromatic ring structure having high etching resistance, and an organic film having high pattern-curving resistance and high dry-etching resistance can be formed. When the above-described polymer is contained, an organic film formed by using the inventive polymer can become a coating film that can suppress a high-aspect line pattern finer than 40 nm from line collapse and twisting after dry etching, in particular, and that is also excellent in in-plane uniformity. In addition, when $W_2$ is introduced, the solvent solubility of the polymer and the etching resistance of an organic film formed by using this polymer can be adjusted, and required properties such as filling and planarizing properties can be adjusted.

Furthermore, in the structure shown by the formula (2), the carbon atom in the top position of the fluorene ring is bonded to the aryl group $W_1$, and $W_2$, being the organic group, hydroxy group, or alkyloxy group. Therefore, the carbon atom in the top position of the fluorene ring in one repeating unit shown by the formula (2) has no attachment points to another atom or atomic group not shown in the formula (2). Molecular weight can be adjusted by introducing the $W_2$, and solvent solubility can be raised in this way. As a result, a polymer having a structure shown by such a formula (2) as a partial structure can exhibit a solvent solubility more excellent than the solvent solubility of a polymer whose carbon atom in the top position of the fluorene skeleton has two polymerization points, and generation of defects can be suppressed. In addition, since solvent solubility is high, an organic film that can exhibit excellent filling property and planarizing property can be formed. Meanwhile, an organic film formed by using the polymer having the partial structure shown by the formula (2) can exhibit sufficient solvent resistance through a heat treatment.

Note that, as described above, the carbon atom in the top position of the fluorene ring in one repeating unit shown by the formula (1) is bonded to another repeating unit, is bonded to a crosslinking group, or is bonded to a terminal group. Therefore, the partial structure shown by the formula (2) is an example of a partial structure shown by the formula (1). That is, a polymer having a partial structure shown by the formula (2) is an example of a polymer having a structure shown by the formula (1) as a partial structure.

Examples of the organic group having at least one aromatic ring in $W_2$ in the general formula (2) include the following, and the aromatic rings thereof may have a substituent such as a vinyl group, an ethynyl group, an ethynylphenyl group, an allyl group, a propargyl group, an aryl group, an allyloxy group, and a propargyloxy group thereon. From the viewpoints of providing etching resistance and solvent solubility, the organic group preferably has a naphthalene ring, a fluorene structure, or a carbazole structure. Note that the organic groups in the following examples may be bonded to the carbon atom in the top position of the fluorene ring in the formula (2) at any point.

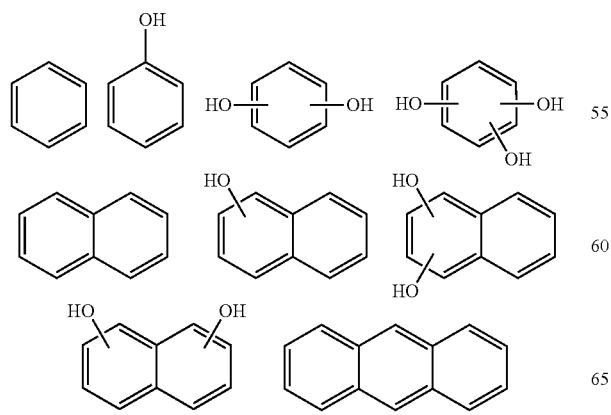

-continued

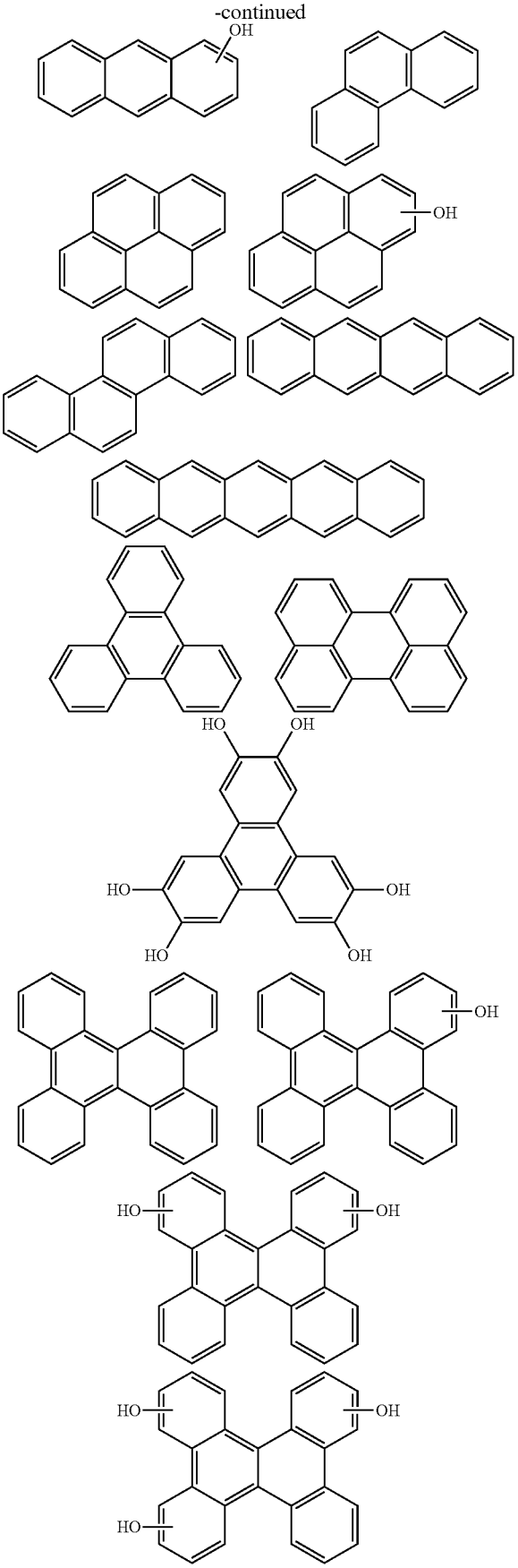

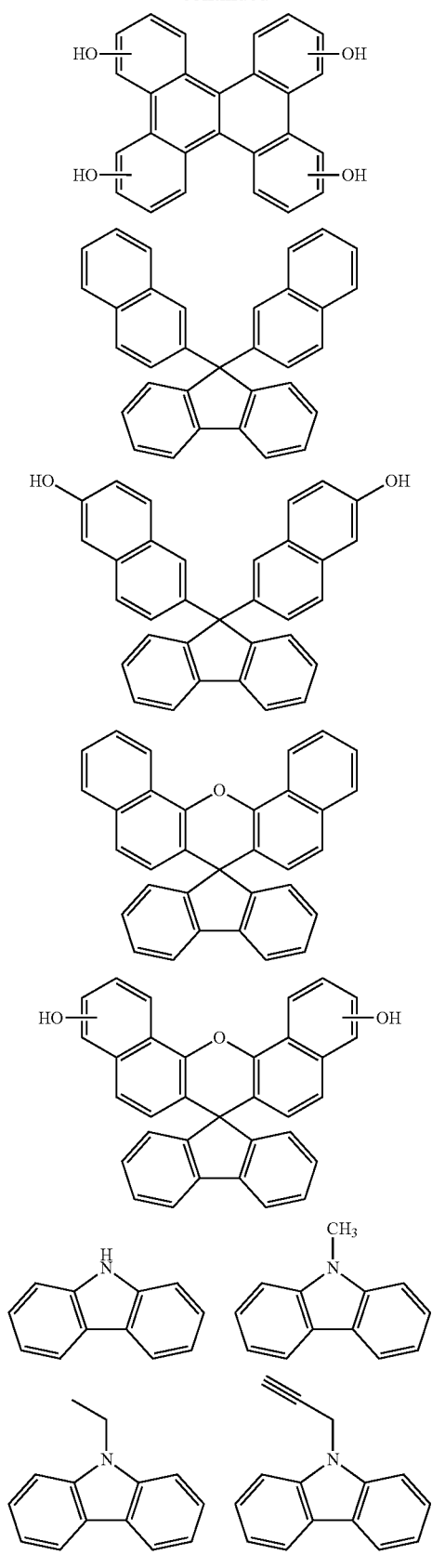
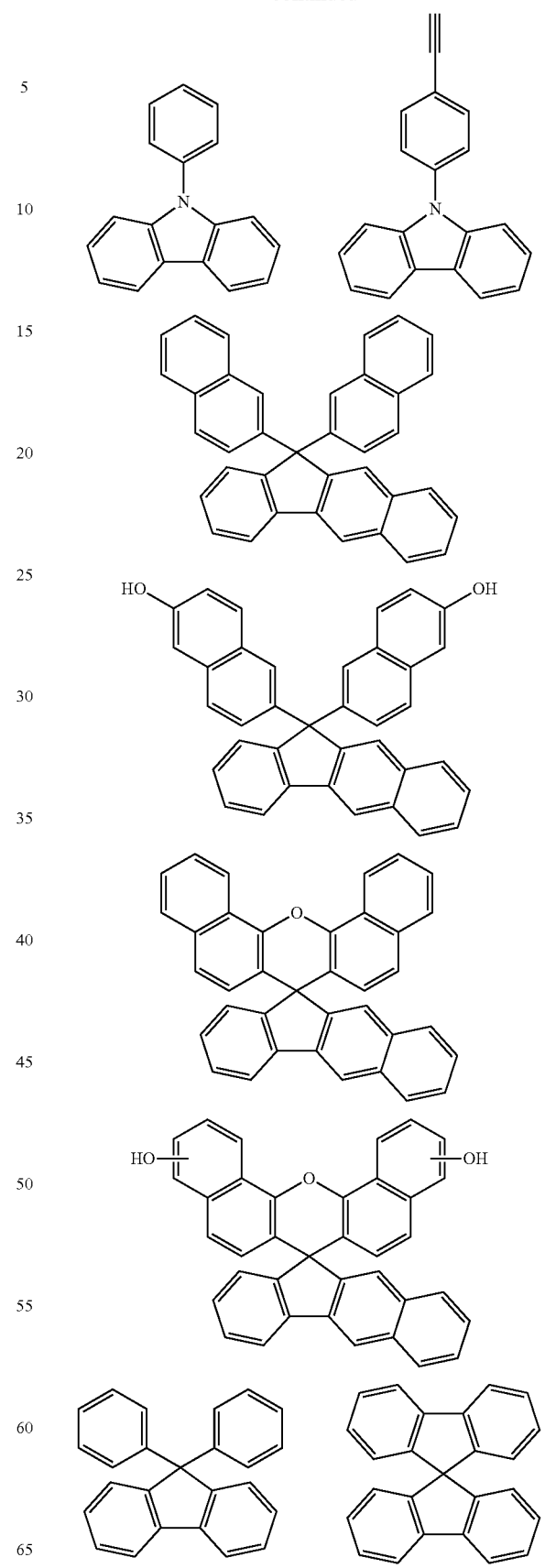

-continued
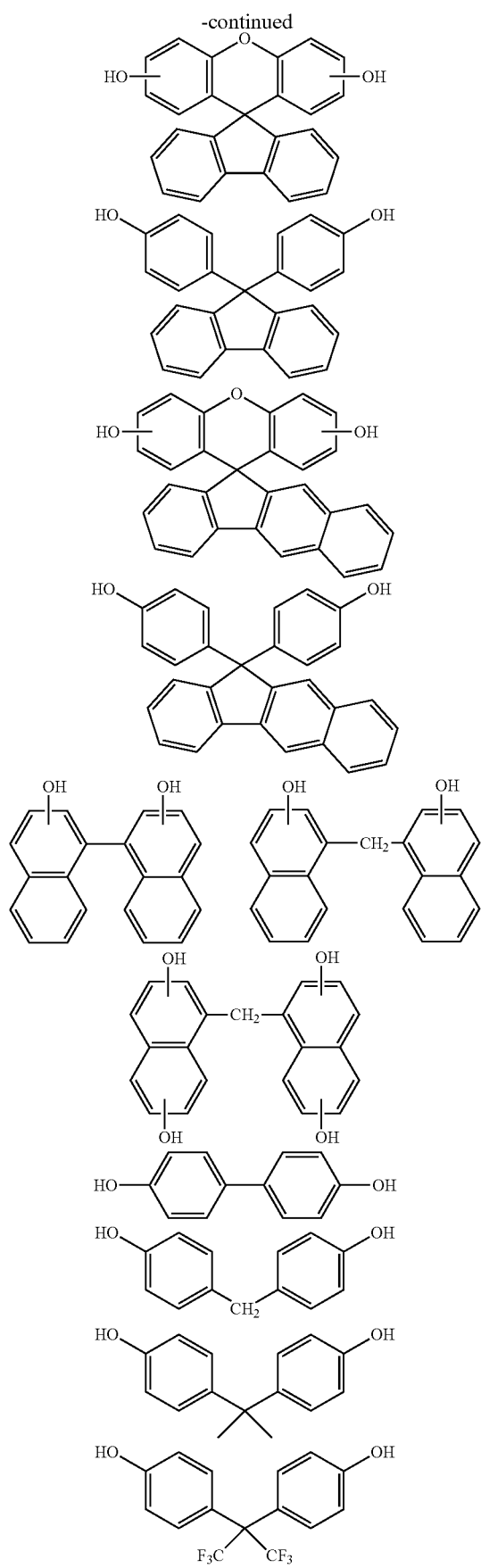
-continued
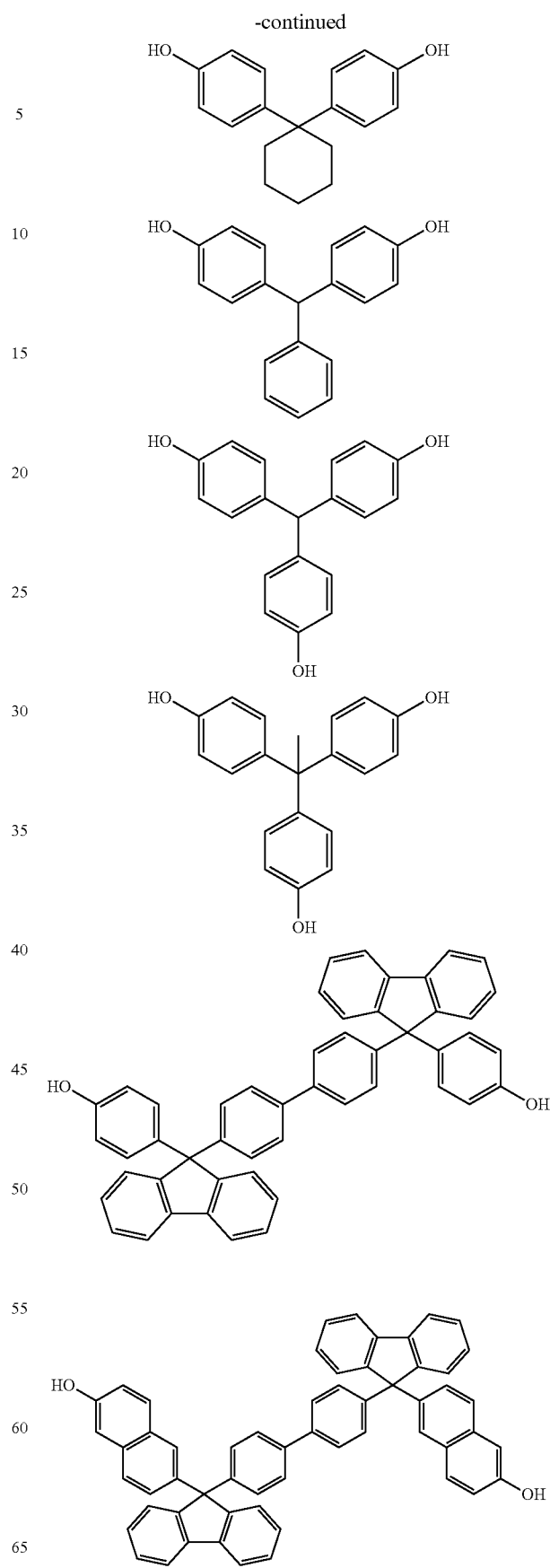

-continued
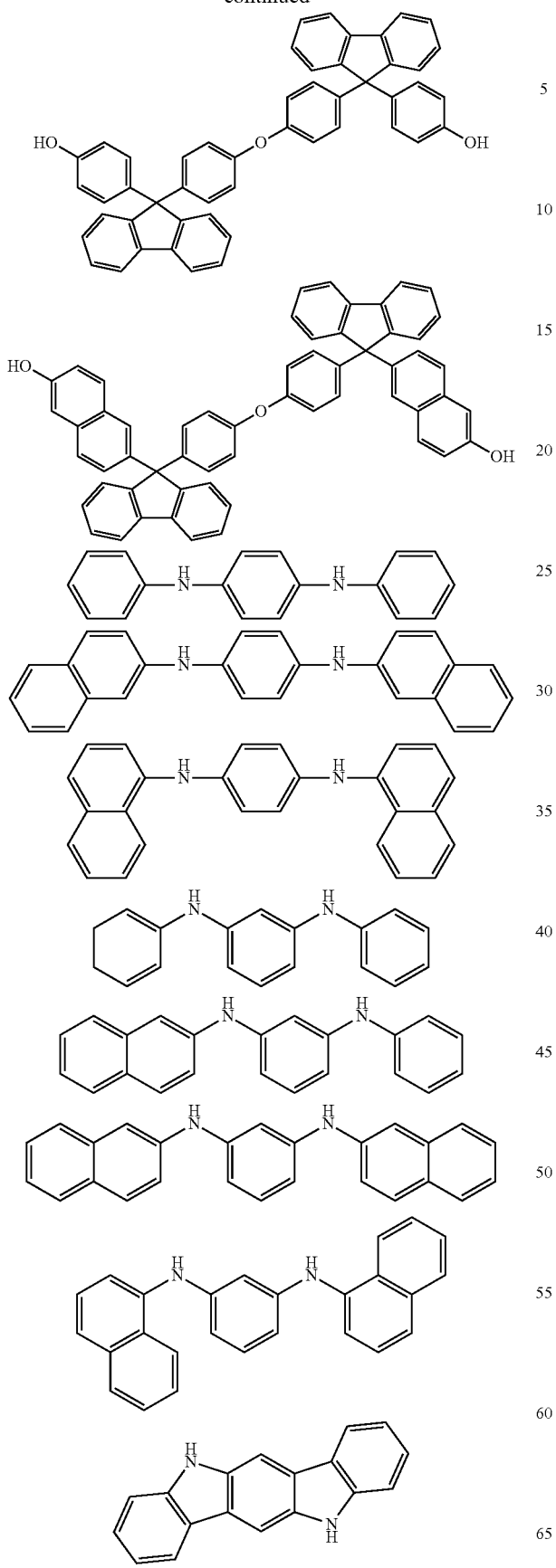
-continued
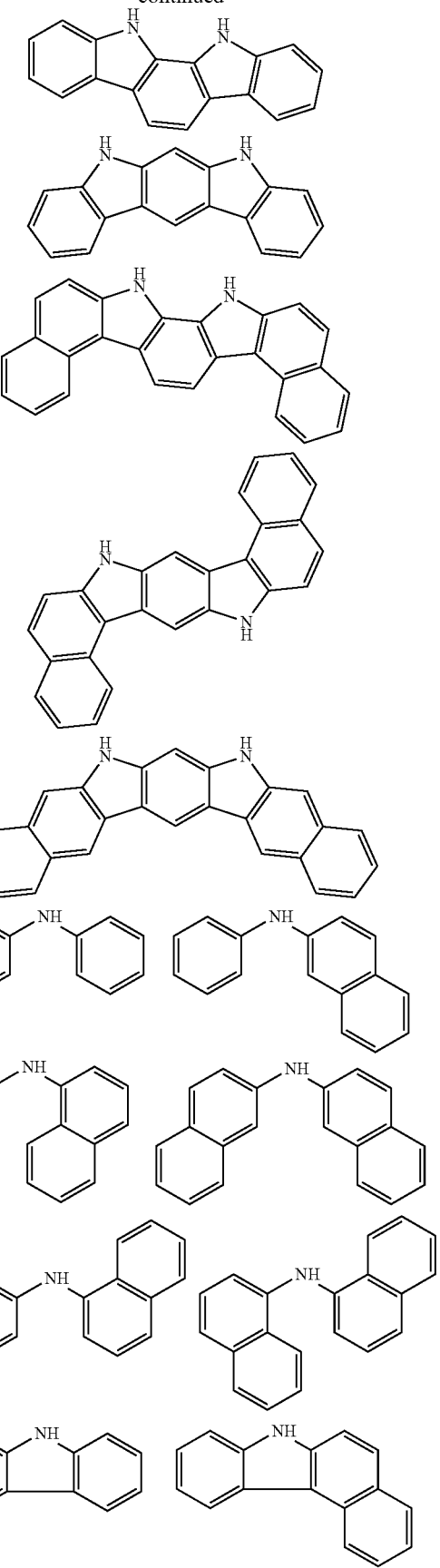

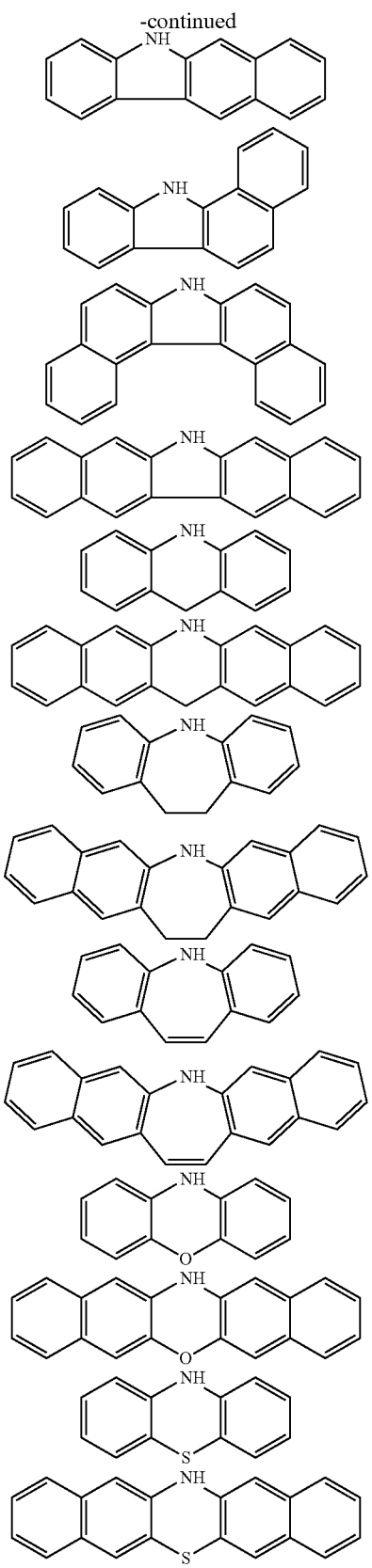

The organic group $W_2$ preferably contains a nitrogen atom. When a polymer having an organic group $W_2$ containing a nitrogen atom introduced into a partial structure is used, it is not only possible to improve solvent solubility, but also to form an organic film that prevents a high-aspect line pattern finer than 40 nm from twisting after dry etching, although the specific reason is unclear.

Meanwhile, when $W_2$ is a hydroxy group or an alkyloxy group, a crosslinking reaction takes place due to an electrophilic substitution reaction where the hydroxy group or the alkyloxy group is eliminated. Thus, the coating film is formed with a condensed aromatic ring structure having higher etching resistance, and an organic film having higher curving resistance and higher dry-etching resistance can be formed.

Furthermore, the polymer having the partial structure shown by the formula (1) or formula (2) preferably has a partial structure shown by the following general formula (3).

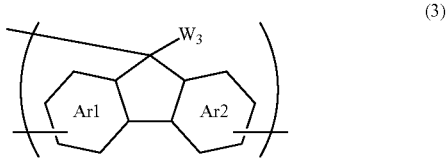

(3)

(In the formula (3), ring structures Ar1 and Ar2 are the above ring structures Ar1 and Ar2, and $W_3$ represents a hydrogen atom.)

Furthermore, when an organic film formed from the polymer having the partial structure shown by the general formula (3) is heated, a crosslinking reaction takes place by a coupling reaction accompanied by the dehydrogenation of hydrogen atoms in the trityl position of the fluorene ring.

When the $W_3$ in the general formula (3) is a hydrogen atom, excellent etching resistance and solvent solubility can be provided.

Furthermore the polymer preferably has an Mw (weight-average molecular weight) of 500 to 5000, and the Mw is more preferably 600 to 4000. When the molecular weight is as described, solubility in an organic solvent can be ensured and a sublimation product generated when baking can be suppressed. Furthermore, since the thermal flowability of the composition for forming an organic film becomes favorable, it is not only possible to favorably fill a fine structure formed on a substrate with the composition for forming an organic film, but also to form an organic film having the entire substrate planarized. Note that in the present invention, the weight-average molecular weight is determined by GPC (gel permeation chromatography) measurement in terms of polystyrene with THF (tetrahydrofuran) as a developing solvent.

<Method for Manufacturing Polymer>

[Polymer Having Partial Structure of General Formula (1)]

Examples of the method for manufacturing the inventive polymer having the structure shown by the general formula (1) as a partial structure include an electrophilic substitution reaction to a fluorene ring accompanied by dehydration where a fluorenol having a tertiary alcohol group shown below, that is, a fluorenol having the aryl group $W_1$ and a tertiary alcohol group is used as a monomer. Ar1, Ar2, and $W_1$ in the following formulae have the same meanings as defined above.

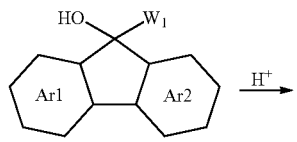

-continued

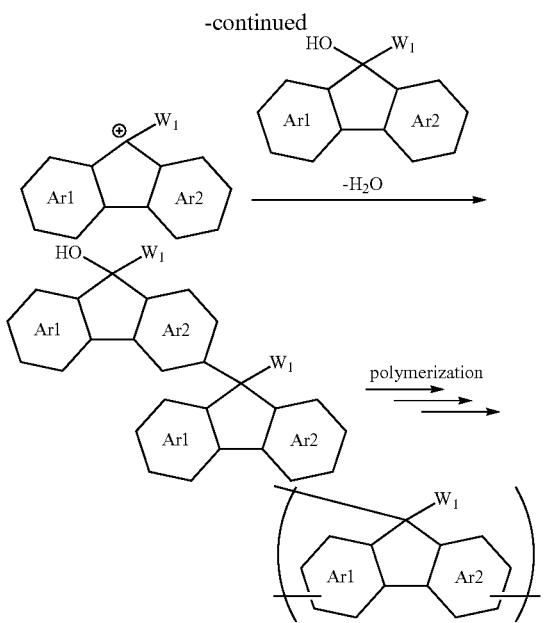

The synthesis of the polymer may be performed with a single fluorenol, or may be performed using two or more different fluorenols.

The polymer can generally be obtained in an organic solvent in the presence of an acid catalyst at room temperature or under cooling or heating as necessary. As the acid catalyst used, it is possible to use inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium (IV) oxide.

Examples of the solvent used are not particularly limited, but include alcohols such as methanol, ethanol, isopropyl alcohol, butanol, ethylene glycol, propylene glycol, diethylene glycol, glycerol, ethylene glycol monomethyl ether, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; non-protic polar solvents such as dimethylsulfoxide, N,N-dimethylformamide, and hexamethylphosphoric triamide; and the like. One kind of these can be used alone or mixture of two or more kinds thereof can be used.

Reaction methods include: a method of charging the fluorenol and the acid catalyst, being a catalyst at once; a method of dispersing or dissolving the fluorenol, then adding the catalyst at once or separately or diluting the catalyst with a solvent and adding dropwise; a method of dispersing or dissolving the catalyst, then adding the fluorenol at once or separately; and a method of diluting the fluorenol with a solvent and adding dropwise. After completion of the reaction, the reaction product can be diluted with an organic solvent to remove the catalyst used in the reaction, then liquid-liquid separation and washing can be performed to collect the target substance.

The organic solvent used in this event is not particularly limited, as long as the organic solvent is capable of dissolving the target substance and is separated into two layers even when mixed with water. Examples of the organic solvent include hydrocarbons such as hexane, heptane, benzene, toluene, and xylene; esters such as ethyl acetate, n-butyl acetate, and propylene glycol methyl ether acetate; ketones such as methyl ethyl ketone, methyl amyl ketone, cyclohexanone, and methyl isobutyl ketone; ethers such as diethyl ether, diisopropyl ether, methyl-t-butyl ether, and ethylcyclopentylmethyl ether; chlorinated solvents such as methylene chloride, chloroform, dichloroethane, and trichloroethylene; mixtures thereof; and the like. As washing water used in this event, generally, what is called deionized water or ultrapure water may be used. The washing may be performed once or more, preferably approximately once to five times because washing ten times or more does not produce the full washing effects thereof.

In the liquid-liquid separation and washing, the washing may be performed with a basic aqueous solution to remove the acidic components in the system. The base specifically includes hydroxides of alkaline metals, carbonates of alkaline metals, hydroxides of alkali earth metals, carbonates of alkali earth metals, ammonia, organic ammonium, and the like.

Further, in the liquid-liquid separation and washing, the washing may be performed with an acidic aqueous solution to remove the metal impurities or basic components in the system. The acid specifically includes inorganic acids such as hydrochloric acid, hydrobromic acid, sulfuric acid, nitric acid, phosphoric acid, and heteropoly acid; organic acids such as oxalic acid, fumaric acid, maleic acid, trifluoroacetic acid, methanesulfonic acid, benzenesulfonic acid, p-toluenesulfonic acid, and trifluoromethanesulfonic acid; and the like.

The liquid-liquid separation and washing may be performed with any one of the basic aqueous solution and the acidic aqueous solution, or can be performed with a combination of the two. The liquid-liquid separation and washing is preferably performed with the basic aqueous solution and the acidic aqueous solution in this order from the viewpoint of removing the metal impurities.

After the liquid-liquid separation and washing with the basic aqueous solution and the acidic aqueous solution, washing with neutral water may be successively performed. The washing may be performed once or more, preferably approximately once to five times. As the neutral water, deionized water, ultrapure water, or the like as mentioned above may be used. The washing may be performed once or more, but if the washing is not performed sufficiently, the basic components and acidic components cannot be removed in some cases. The washing is preferably performed approximately once to five times because washing ten times or more does not always produce the full washing effects thereof.

Further, the reaction product after the liquid-liquid separation can also be collected as a powder by concentrating and drying the solvent or crystallizing the reaction product, under reduced pressure or normal pressure. Alternatively, the reaction product can also be retained in the state of solution with an appropriate concentration to improve the workability in preparing the composition for forming an organic film. The concentration in this event is preferably 0.1 to 50 mass %, more preferably 0.5 to 30 mass %. With such a concentration, the viscosity is hardly increased, making it possible to prevent deterioration of the workability; in addition, since the amount of the solvent is not excessive, the solution can be prepared economically.

The solvent in this event is not particularly limited, as long as the solvent is capable of dissolving the polymer. Specific examples of the solvent include ketones such as cyclohexanone and methyl-2-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, and propylene glycol mono-tert-butyl ether acetate. One of these can be used alone or mixture of two or more thereof can be used.

[Polymer Having Partial Structure of General Formula (2)]

{Polymer Where $W_2$ Represents Organic Group Having Aromatic Ring}

When $W_2$ has at least one aromatic ring, the inventive polymer having the partial structure shown by the general formula (2) can be manufactured by: a method of copolymerizing a fluorenol, being a raw material for manufacturing a polymer having the partial structure shown by the general formula (1), and a compound having the organic group $W_2$ as a partial structure; a method of adding a compound having the organic group $W_2$ as a partial structure during the reaction of the polymer having the partial structure shown by the general formula (1) and capping the end; or the like. Ar1, Ar2, $W_1$, and $W_2$ in the following formulae have the same meanings as defined above.

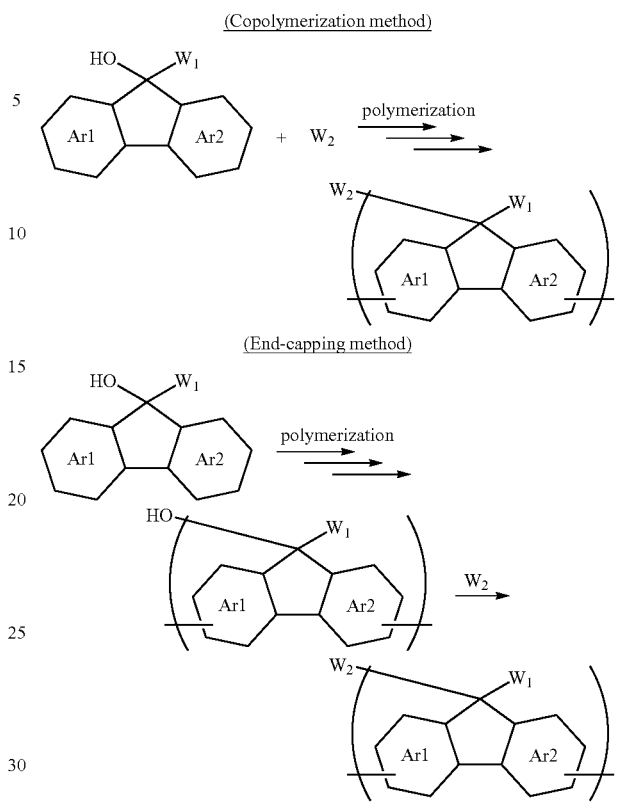

When the above-described reaction is performed using a compound having an organic group having at least one aromatic ring as the $W_2$, the compound having the partial structure of $W_2$ acts as an end-cap of a polymer of a fluorenol halfway polymerized, the aromatic ring of the compound having the partial structure of $W_2$ and a fluorenol polymer having a different chain length may react in the reaction as shown below, but in the present invention, the notation is as in the general formula (2) for convenience. Ar1, Ar2, $W_1$, and $W_2$ have the same meanings as defined above, and n1, n2, and n3 are integers of 1 or more.

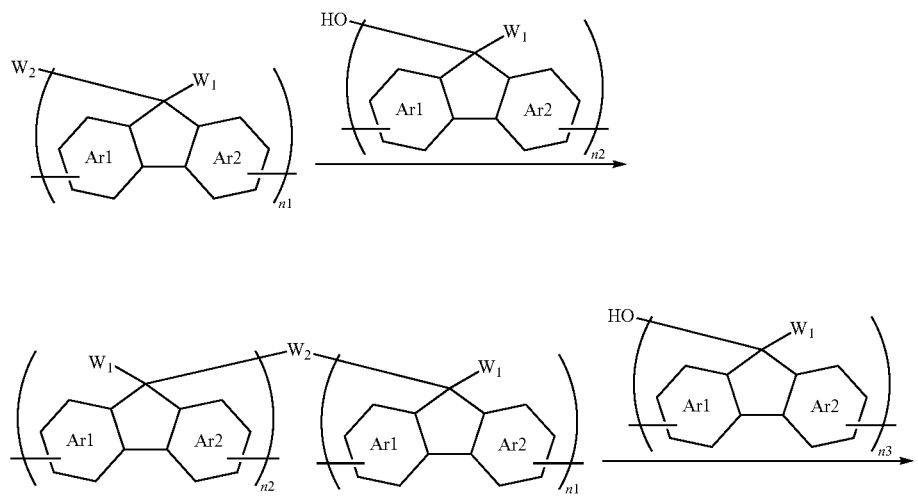

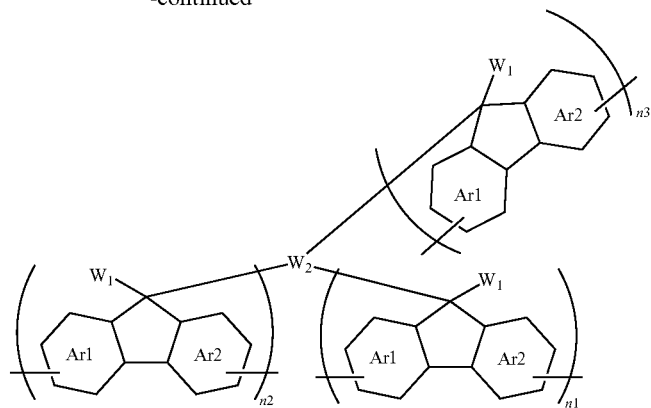

When copolymerization or end-capping is performed using the compound having the partial structure of the $W_2$, molecular weight can be adjusted, and therefore, solvent solubility can be raised.

Methods for the reaction and collection of the polymer having the partial structure shown by the general formula (2) are the same as the methods for the reaction and collection of the polymer having the partial structure shown by the general formula (1).

{Polymer Where $W_2$ Represents Hydroxy Group or Alkyloxy Group}

Meanwhile, when $W_2$ represents a hydroxy group or an alkyloxy group having 1 to 10 carbon atoms, the inventive polymer having the partial structure shown by the general formula (2) can be manufactured by adding water or alcohol into the reaction system beforehand or by adding water or alcohol during the reaction. R in the following formulae represents a hydrogen atom or an alkyl group having 1 to 10 carbon atoms. That is, the group OR in the following formulae is the $W_2$ in the formula (2). Ar1, Ar2, and $W_1$ have the same meanings as defined above.

(Copolymerization method)

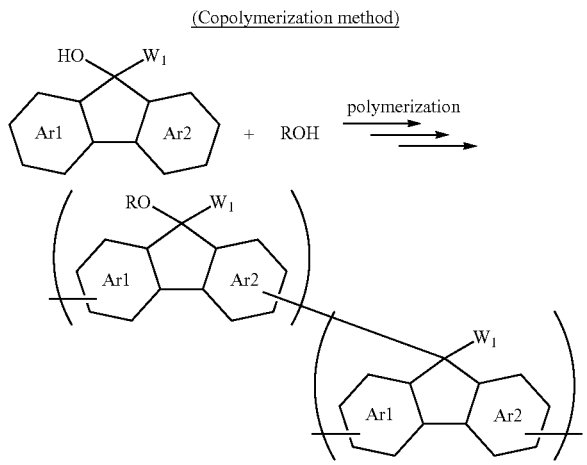

(Multistage polymerization method)

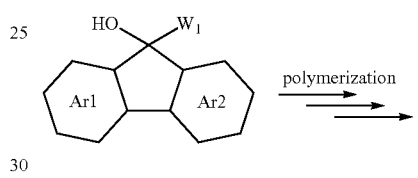

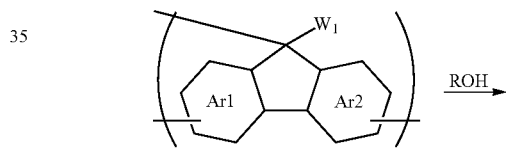

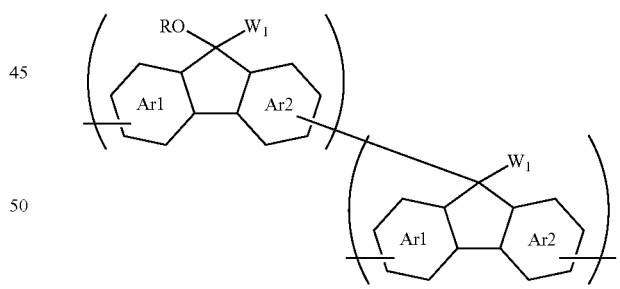

In the polymerization, in the same manner as when a fluorenol and a compound having an organic group having at least one aromatic ring as the $W_2$ react, a plurality of fluorenol polymers produced during the polymerization may react on the aromatic rings Ar1 and Ar2 of the fluorenol as in the following formulae, for example, but in the present invention, the notation is as in the chemical formula (2) for convenience. Ar1 and Ar2 have the same meanings as defined above, n1, n2, and n3 represent integers of 1 or more, and R represents a hydrogen atom or an alkyl group having 1 to 10 carbon atoms.

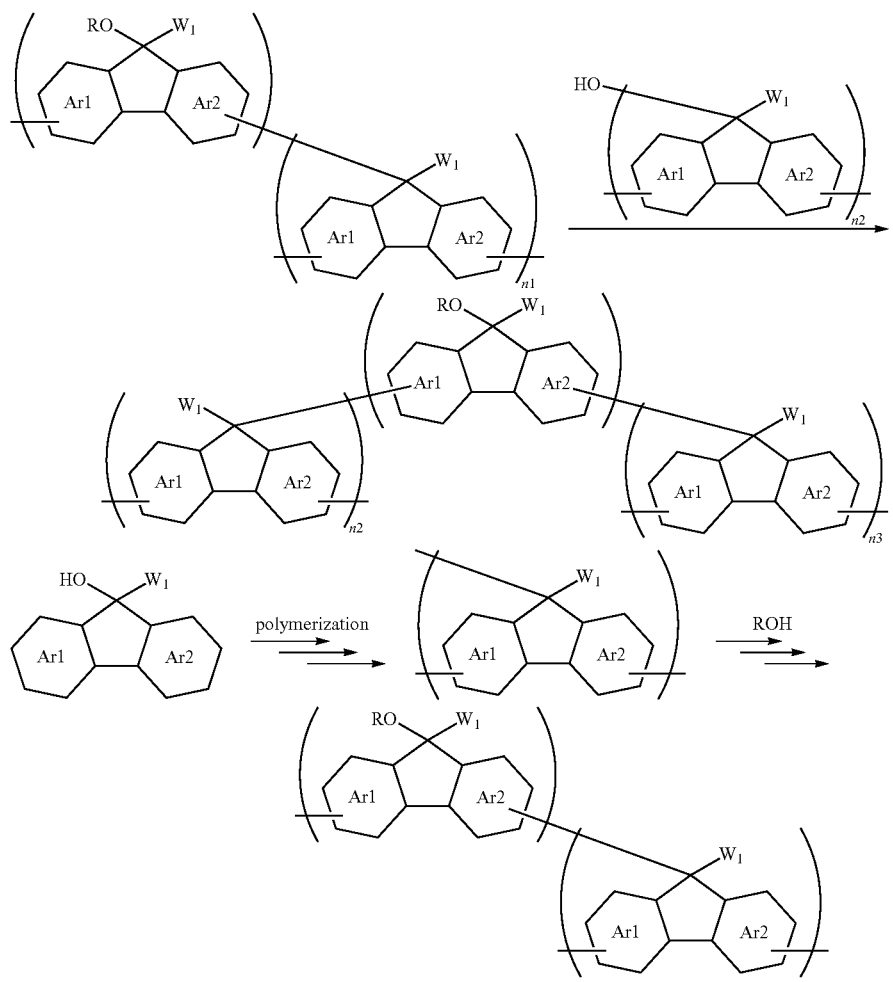

When $W_2$ is a hydroxy group or an alkyloxy group having 1 to 10 carbon atoms, the molecular weight of the polymer can be adjusted, and since a heteroatom is introduced, solvent solubility can be raised.

Methods for the reaction and collection of the polymer are the same as the methods for the reaction and collection of the polymer having the partial structure shown by the general formula (1).

[Polymer Having Partial Structure of General Formula (3)]

For the inventive polymer having the partial structure shown by the general formula (3), methods include: a method of charging a fluorenol, being a raw material for manufacturing a polymer having the partial structure shown by the general formula (1), and a fluorenol having a secondary alcohol group at once and copolymerizing; a method of polymerizing a first fluorenol, being a raw material for the polymer having the partial structure shown by the general formula (1) or a second fluorenol having a secondary alcohol group in the first stage, and then adding a fluorenol different from the fluorenol in the first stage in the second stage and polymerizing; or the like. Furthermore, when the polymerization is performed in two stages, it is also possible to use a mixture of a plurality of fluorenols in the polymerization in the first stage or the second stage, and it is also possible to add the same or different fluorenol in a further third stage or fourth stage and polymerize.

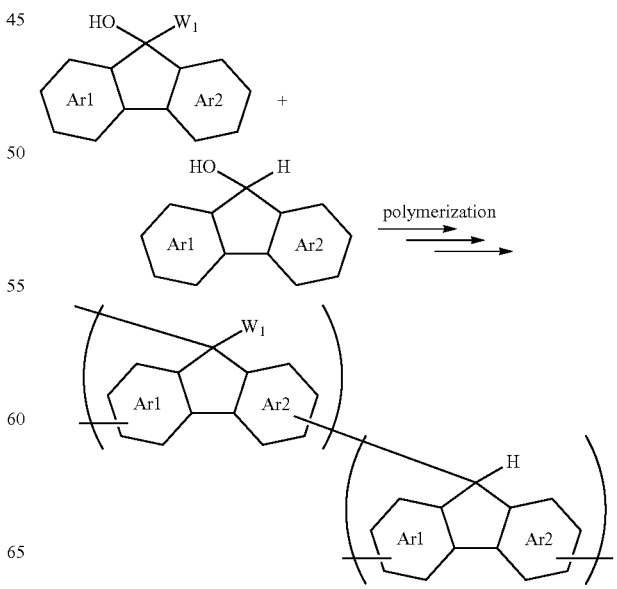

-continued (Multistage polymerization method)

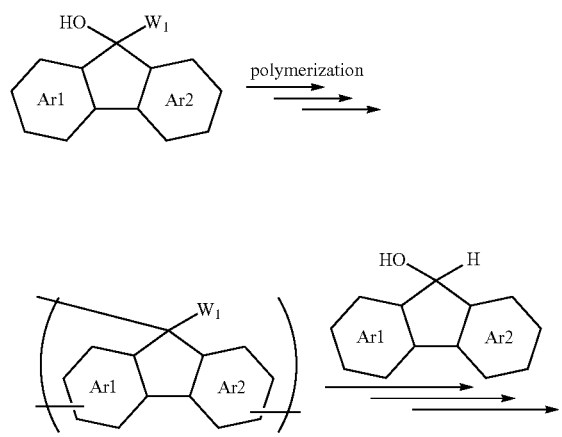

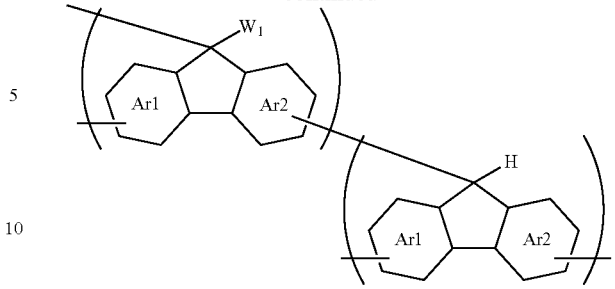

In the polymerization, in the same manner as when a fluorenol and a compound having an organic group having at least one aromatic ring as the $W_2$ react, a plurality of fluorenol polymers produced during the polymerization may react on the aromatic rings Ar1 and Ar2 of the fluorenol as in the following formulae, for example, but in the present invention, the notation is as in the chemical formula (3) for convenience. Ar1, Ar2, and $W_1$ have the same meanings as defined above, and n1, n2, and n3 represent integers of 1 or more.

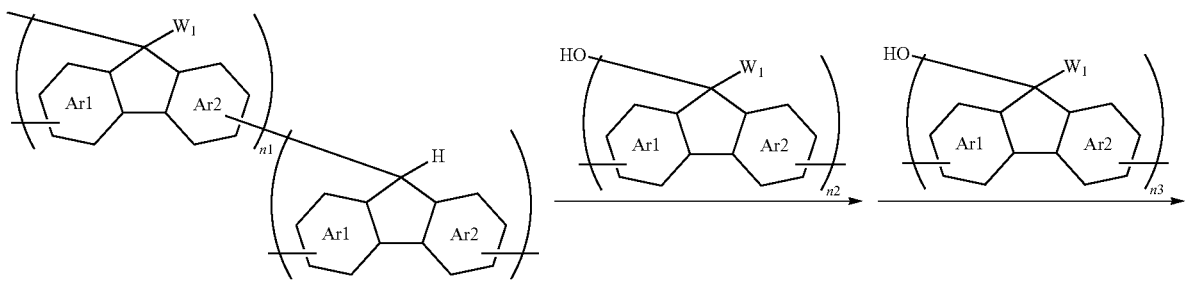

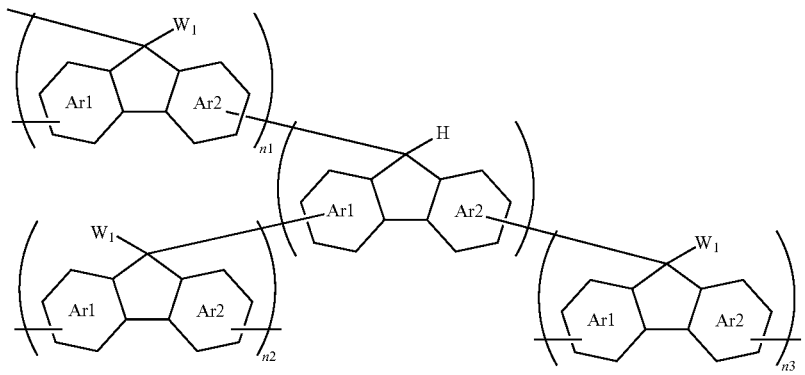

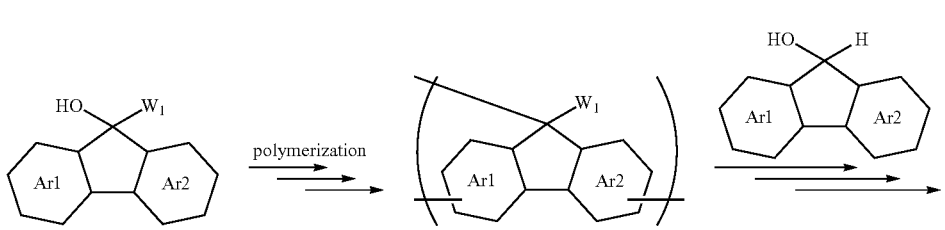

-continued

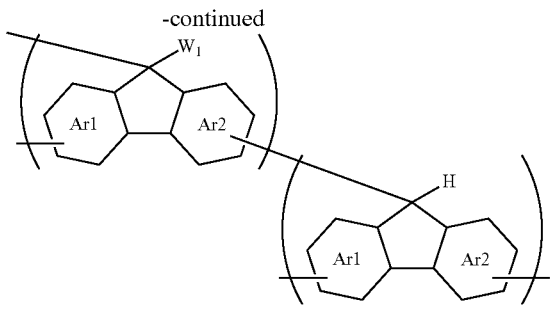

In the polymerization of the inventive polymer having the partial structure shown by the general formula (1), a fluorenol having the $W_2$ or the $W_3$ as a partial structure can be used in combination in addition to a fluorenol having an aryl group $W_1$ and a tertiary alcohol group according to the required properties. Specifically, a side chain structure that contributes to enhancement of planarizing property or a rigid aromatic ring structure that contributes to improvement of etching resistance and heat resistance can be introduced into the structure of the fluorenol having the $W_2$ or the $W_3$ as a partial structure and can be used, and the raw materials can be combined in any proportions according to the required properties. In addition, the method for manufacturing the polymer can also be selected according to the required properties, and by appropriately selecting copolymerization, multistage polymerization, and end-capping method, the structure of the polymer, for example, random or alternating polymer, can be controlled. A composition for forming an organic film using these polymers can achieve all of higher filling and planarizing properties, heat resistance, twisting resistance, and etching resistance.

As described above, the inventive polymer having the partial structure shown by the general formula (1) or (2) or having the partial structure shown by the general formula (1) or (2) and the partial structure shown by the general formula (3) can exhibit high etching resistance and excellent twisting resistance, and is excellent in solvent solubility, and can therefore provide a composition for forming an organic film with low generation of defects.

<Coating-Type Composition for Forming Organic Film>

In addition, the present invention provides a coating-type composition for forming an organic film containing: a polymer having the partial structure shown by the general formula (1) or (2) or having the partial structure shown by the general formula (1) or (2) and the partial structure shown by the general formula (3); and an organic solvent. Note that in the inventive coating-type composition for forming an organic film, one of the polymer having the partial structure shown by the general formula (1) or (2) or having the partial structure shown by the general formula (1) or (2) and the partial structure shown by the general formula (3) can be used alone or combination of two or more thereof can be used.

The inventive coating-type composition for forming an organic film may be further blended with a modifier such as a compound for blending or another polymer. The modifier, by being contained in the inventive coating-type composition for forming an organic film, serves to improve the film-formability with spin-coating and the filling property for a stepped substrate. Examples of such a modifier include novolak resins of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene)bisphenol, 2,2'diphenyl-4,4'-(9H-fluorene-9-ylidene)bisphenol, 2,2'dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2-naphthol, dihydroxynaphthalenes such as 1,5-dihydroxynaphthalene, 1,7-dihydroxynaphthalene, and 2,6-dihydroxynaphthalene, methyl 3-hydroxynaphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborna-2-ene, α-pinene, β-pinene, limonene, etc.; and polyhydroxystyrene, polystyrene, polyvinylnaphthalene, polyvinylanthracene, polyvinylcarbazole, polyindene, polyacenaphthylene, polynorbornene, polycyclodecene, polytetracyclododecene, polynortricyclene, poly(meth)acrylate, and copolymers thereof. It is also possible to blend a naphthol dicyclopentadiene copolymer disclosed in JP 2004-205685 A, a fluorene bisphenol novolak resin disclosed in JP 2005-128509 A, an acenaphthylene copolymer disclosed in JP 2005-250434 A, fullerene having a phenol group disclosed in JP 2006-227391 A, a bisphenol compound and a novolak resin thereof disclosed in JP 2006-293298 A, a novolak resin of an adamantane phenol compound disclosed in JP 2006-285095 A, a bisnaphthol compound and a novolak resin thereof disclosed in JP 2010-122656 A, a fullerene resin compound disclosed in JP 2008-158002 A, or the like. The modifier is blended in an amount of preferably 0 to 1,000 parts by mass, more preferably 0 to 500 parts by mass, based on 100 parts by mass the inventive polymer having the partial structure shown by the general formula (1) or (2) or having the partial structure shown by the general formula (1) or (2) and the partial structure shown by the general formula (3).

[Organic Solvent]

The organic solvent usable in the inventive coating-type composition for forming an organic film is not particularly limited, as long as the organic solvent is capable of dissolving the polymer having the partial structure shown by the general formula (1) or (2) or having the partial structure shown by the general formula (1) or (2) and the partial structure shown by the general formula (3) and optional components, for example, an acid generator, a crosslinking agent, and other additives, etc. described below. Specifically, a solvent having a boiling point of lower than 160° C. can be used, such as solvents disclosed in paragraphs (0091) to (0092) of JP 2007-199653 A. Above all, it is preferable to use propylene glycol monomethyl ether acetate, propylene glycol monomethyl ether, 2-heptanone, cyclopentanone, cyclohexanone, and a mixture of two or more thereof.

Such a composition can be applied by spin-coating. Since the inventive polymer having the partial structure shown by the general formula (1) or (2) or having the partial structure shown by the general formula (1) or (2) and the partial structure shown by the general formula (3) as described above is incorporated, the coating-type composition for forming an organic film has favorable pattern-curving resistance and favorable dry-etching resistance, and at the same time, generation of defects can be suppressed. In addition, such a composition enables formation of an organic film having both heat resistance and high filling and planarizing properties.

Furthermore, in the inventive coating-type composition for forming an organic film, it is also possible to use an organic solvent having a high-boiling-point solvent having a boiling point of 160° C. or higher added to the above-described solvent having a boiling point of lower than 160° C. (a mixture of one or more organic solvents having a boiling point of lower than 160° C. and one or more organic solvents having a boiling point of 160° C. or higher). The high-boiling-point organic solvent is not particularly limited as long as the high-boiling-point organic solvent can dissolve a polymer having the partial structure shown by the general formula (1) or (2) or having the partial structure shown by the general formula (1) or (2) and the partial structure shown by the general formula (3), and examples include hydrocarbons, alcohols, ketones, esters, ethers, chlorinated solvents, and so forth. Specific examples of the high-boiling-point organic solvent include 1,2,4-trimethylbenzene, 3-methoxybutanol, 3-methyl-3-methoxybutanol, 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol, diethylene glycol dimethyl ether, monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, propylene glycol monoethyl ether acetate, ethyl 3-ethoxypropionate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, dibutyl adipate, etc. These may be used alone or in mixture thereof.

The boiling point of the high-boiling-point solvent may be appropriately selected according to the temperature at which the coating-type composition for forming an organic film is heated. The boiling point of the high-boiling-point solvent to be added is preferably 160° C. to 300° C. The boiling point of 160° C. or higher prevents the evaporation rate at baking (heating) from becoming excessive, which would otherwise occur if the boiling point is too low. Thus, sufficient thermal flowability can be obtained. Meanwhile, when the boiling point is 300° C. or lower, the boiling point is not too high, so that the high-boiling-point solvent evaporates after baking and does not remain in the organic film. Thus, the organic film properties such as etching resistance are not adversely affected.

When the high-boiling-point solvent is used, the high-boiling-point solvent is blended in an amount of preferably 1 to 50 parts by mass based on 100 parts by mass of the solvent having a boiling point of lower than 160° C. The high-boiling-point solvent in such a formulation amount prevents a failure in providing sufficient thermal flowability during baking, and degradation of the film properties such as etching resistance, which would otherwise occur if the high-boiling-point solvent remains in the organic film.

In such a coating-type composition for forming an organic film, the polymer having the partial structure shown by the general formula (1) or (2) or having the partial structure shown by the general formula (1) or (2) and the partial structure shown by the general formula (3) is provided with thermal flowability by adding the high-boiling-point solvent, so that the coating-type composition for forming an organic film has both high filling and planarizing properties.

[Other Additives]

In the inventive coating-type composition for forming an organic film, an acid generator can be added so as to further promote the curing reaction. The acid generator includes a material that generates an acid by thermal decomposition, and a material that generates an acid by light irradiation. Any acid generator can be added. Specifically, materials disclosed in paragraphs (0061) to (0085) of JP 2007-199653 A can be added, but the present invention is not limited thereto.

One kind of the acid generator, or a combination of two or more thereof can be used. When the acid generator is added, the amount to be added is preferably 0.05 to 50 parts by mass, more preferably 0.1 to 10 parts by mass, based on 100 parts by mass of the polymer having the partial structure shown by the general formula (1) or (2) or having the partial structure shown by the general formula (1) or (2) and the partial structure shown by the general formula (3).

To the inventive coating-type composition for forming an organic film, a surfactant can be added so as to improve the coating property in spin-coating. As the surfactant, for example, those disclosed in (0142) to (0147) of JP 2009-269953 A can be used.

Moreover, to the inventive coating-type composition for forming an organic film, a crosslinking agent can also be added so as to increase the curability and to further suppress intermixing with an upper layer film. The crosslinking agent is not particularly limited, and known various types of crosslinking agents can be widely used. Examples thereof include melamine-based crosslinking agents, glycoluril-based crosslinking agents, benzoguanamine-based crosslinking agents, urea-based crosslinking agents, p-hydroxyalkylamide-based crosslinking agents, isocyanurate-based crosslinking agents, aziridine-based crosslinking agents, oxazoline-based crosslinking agents, epoxy-based crosslinking agents, and tertiary-alcohol-based crosslinking agent.

Specific examples of the melamine-based crosslinking agents include hexamethoxymethylated melamine, hexabutoxymethylated melamine, alkoxy- and/or hydroxy-substituted derivatives thereof, and partial self-condensates thereof. Specific examples of the glycoluril-based crosslinking agents include tetramethoxymethylated glycoluril, tetrabutoxymethylated glycoluril, alkoxy- and/or hydroxy-substituted derivatives thereof, and partial self-condensates thereof. Specific examples of the benzoguanamine-based crosslinking agents include tetramethoxymethylated benzoguanamine, tetrabutoxymethylated benzoguanamine, alkoxy- and/or hydroxy-substituted derivatives thereof, and partial self-condensates thereof. Specific examples of the urea-based crosslinking agents include dimethoxymethylated dimethoxyethyleneurea, alkoxy- and/or hydroxy-substituted derivatives thereof, and partial self-condensates thereof. A specific example of the β-hydroxyalkylamide-based crosslinking agents includes N,N,N',N'-tetra(2-hydroxyethyl)adipic acid amide. Specific examples of the isocyanurate-based crosslinking agents include triglycidyl isocyanurate and triallyl isocyanurate. Specific examples of the aziridine-based crosslinking agents include 4,4'-bis(ethyleneiminocarbonylamino)diphenylmethane and 2,2-bishydroxymethylbutanol-tris[3-(1-aziridinyl)propionate]. Specific examples of the oxazoline-based crosslinking agents include 2,2'-isopropylidenebis(4-benzyl-2-oxazoline), 2,2'-isopropylidenebis(4-phenyl-2-oxazoline), 2,2'-methylenebis4,5-diphenyl-2-oxazoline, 2,2'-methylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and a 2-isopropenyloxazoline copolymer. Specific examples of the epoxy-based crosslinking agents include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether.

Specific examples of the tertiary-alcohol-based crosslinking agents include the compounds in the following formulae, but are not limited thereto.

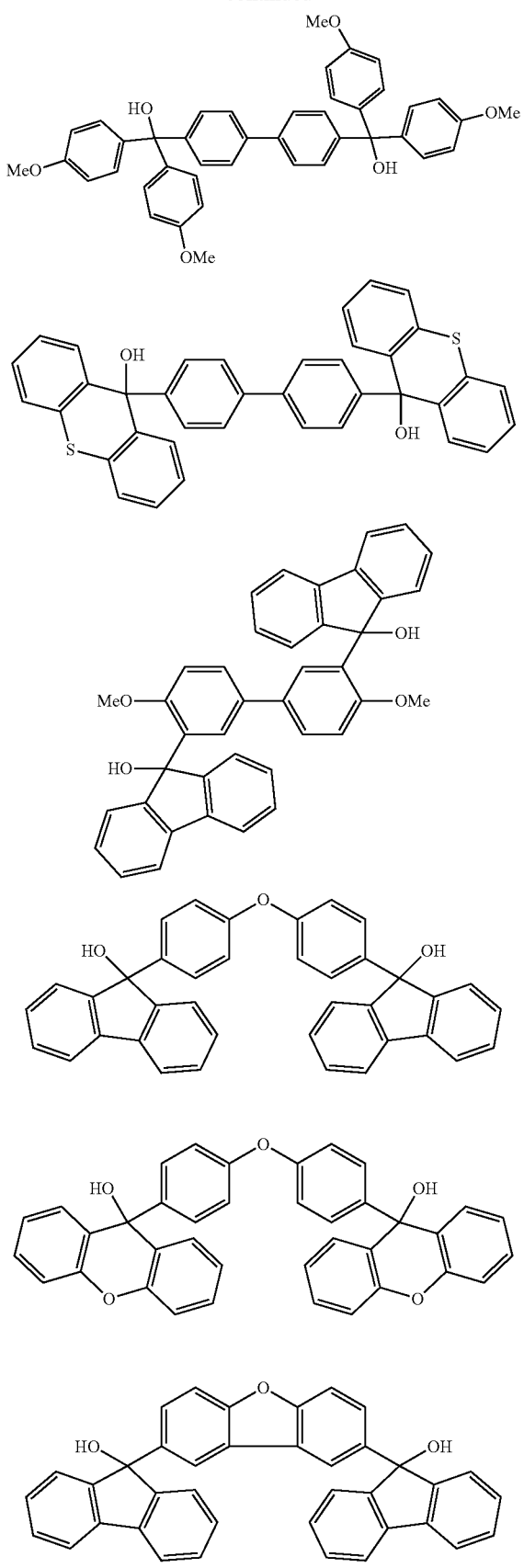

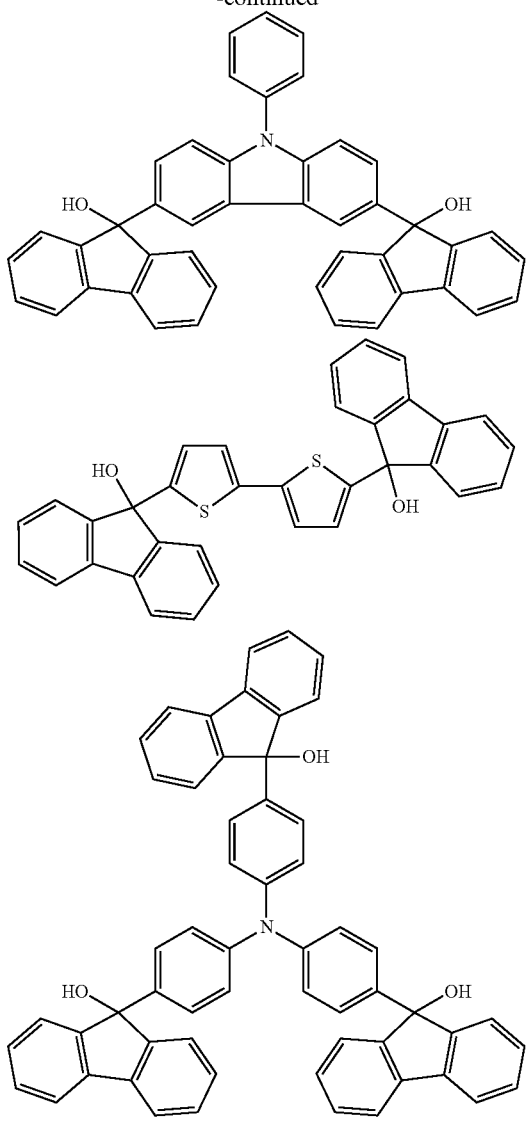

Further, to the inventive coating-type composition for forming an organic film, a plasticizer can be added so as to further improve the planarizing and filling properties. The plasticizer is not particularly limited, and known various types of plasticizers can be widely used. Examples thereof include low-molecular-weight compounds such as phthalic acid esters, adipic acid esters, phosphoric acid esters, trimellitic acid esters, and citric acid esters; and polymers such as polyethers, polyesters, and polyacetal-based polymers disclosed in JP 2013-253227 A.

Further, as an additive for imparting the filling and planarizing properties to the inventive coating-type composition for forming an organic film as the plasticizer, it is preferable to use, for example, liquid additives having polyethylene glycol or polypropylene glycol structure, or thermo-decomposable polymers having a weight loss ratio between 30° C. and 250° C. of 40 mass % or more and a weight-average molecular weight of 300 to 200,000. The thermo-decomposable polymers preferably contain a repeating unit having an acetal structure shown by the following general formula (DP1) or (DP1a).

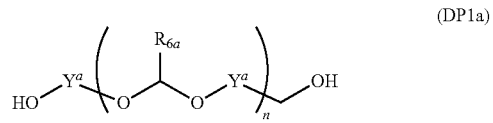

(In the formula, $R_6$ represents a hydrogen atom or a saturated or unsaturated monovalent organic group having 1 to 30 carbon atoms which may be substituted. $Y_1$ represents a saturated or unsaturated divalent organic group having 2 to 30 carbon atoms.)

$$HO-Y^a-\left(O-\underset{R_{6a}}{\underset{|}{C}H}-O-Y^a\right)_n-OH \quad (DP1a)$$

(In the formula, $R_{6a}$ represents an alkyl group having 1 to 4 carbon atoms. $Y^a$ represents a saturated or unsaturated divalent hydrocarbon group having 4 to 10 carbon atoms which may have an ether bond. "n" represents an average repeating unit number of 3 to 500.)

Note that one kind of the inventive coating-type composition for forming an organic film can be used alone, or two or more kinds thereof can be used in combination. The coating-type composition for forming an organic film can be used as a material for forming an organic film to be provided underneath a resist underlayer film or a planarizing material for manufacturing a semiconductor device.

Moreover, the inventive coating-type composition for forming an organic film is extremely useful as an organic film material for multilayer resist processes such as a 2-layer resist process, a 3-layer resist process using a silicon-containing underlayer film, and a 4-layer resist process using a silicon-containing inorganic hard mask and an organic antireflective coating.

<Method for Forming Organic Film>

The inventive coating-type composition for forming an organic film can be used to form an organic film which serves as a resist underlayer film in a multilayer resist film used in lithography or a planarizing film for manufacturing a semiconductor.

In this example of a method for forming an organic film, a substrate to be processed is coated with the inventive coating-type composition for forming an organic film by a spin-coating method etc. By employing a method like spin-coating method, favorable filling property can be obtained. After the spin-coating, baking (heating) is performed to evaporate the solvent and to promote the crosslinking reaction, thereby preventing the mixing with a resist upper layer film or a resist underlayer film. The baking is preferably performed at 100° C. or higher to 600° C. or lower for 10 to 600 seconds, more preferably at 200° C. or higher to 500° C. or lower for 10 to 300 seconds. In considering the influences of device damage and wafer deformation, the upper limit of the heating temperature in lithographic wafer process is preferably 600° C. or lower, more preferably 500° C. or lower.

Moreover, after a substrate to be processed is coated with the inventive coating-type composition for forming an organic film by the spin-coating method or the like as described above, the coating-type composition for forming an organic film is cured by baking in an atmosphere with an oxygen concentration of 0.1% or more and 21% or less so that an organic film can be formed.

A sufficiently cured organic film can be obtained by baking the inventive coating-type composition for forming an organic film in such an oxygen atmosphere. The atmosphere during the baking may be in air. Nevertheless, it is preferable to introduce an inert gas such as $N_2$, Ar, or He to reduce oxygen amount from the viewpoint of preventing oxidation of the organic film. To prevent the oxidation, the oxygen concentration needs to be controlled, and is preferably 1000 ppm or less, more preferably 100 ppm or less. Preventing the oxidation of the organic film during baking is preferable because an increase in absorption and a decrease in etching resistance are prevented.

Because of the excellent filling and planarizing properties, the method for forming an organic film as described above can provide a flat organic film regardless of unevenness of a substrate to be processed. Accordingly, the method is extremely useful in forming a flat organic film on a substrate to be processed which has a structure or a step with a height of 30 nm or more. Note that the thickness of the organic film such as a resist underlayer film or a planarizing film for manufacturing a semiconductor device is appropriately determined and is preferably 30 to 20,000 nm, more preferably 50 to 15,000 nm.

<Patterning Process>

The present invention provides a patterning process according to a 3-layer resist process using the coating-type composition for forming an organic film as described above. The patterning process is a method for forming a pattern in a substrate to be processed, and includes at least the following steps:

forming an organic film by using the inventive composition for forming an organic film on a body to be processed;

forming a silicon-containing resist underlayer film by using a silicon-containing resist underlayer film material on the organic film;

forming a resist upper layer film by using a photoresist composition on the silicon-containing resist underlayer film;

forming a circuit pattern in the resist upper layer film;

transferring the pattern to the silicon-containing resist underlayer film by etching the silicon-containing resist underlayer film while using the resist upper layer film having the formed pattern as a mask;

transferring the pattern to the organic film by etching the organic film while using the silicon-containing resist underlayer film having the transferred pattern as a mask; and forming the pattern on the body to be processed by etching the body to be processed while using the organic film having the transferred pattern as a mask.

The silicon-containing resist underlayer film in this 3-layer resist process exhibits etching resistance to an oxygen gas or a hydrogen gas. Thus, when the organic film is dry-etched while using the silicon-containing resist underlayer film as a mask in the 3-layer resist process, the dry etching is preferably performed using an etching gas mainly containing an oxygen gas or a hydrogen gas.

As the silicon-containing resist underlayer film in the 3-layer resist process, a polysiloxane-based underlayer film is also preferably used. The silicon-containing resist underlayer film having antireflective effect can suppress the reflection. Particularly, when, for 193-nm light exposure, a material containing many aromatic groups and having high etching selectivity relative to the substrate is used as an organic film, the k-value and thus the substrate reflection are increased; in contrast, the reflection can be suppressed by imparting absorption to the silicon-containing resist underlayer film so as to have an appropriate k-value, and the substrate reflection can be reduced to 0.5% or less. As the silicon-containing resist underlayer film having antireflective effect, a polysiloxane is preferably used which has anthracene for 248-nm and 157-nm light exposure, or a phenyl group or a light-absorbing group having a silicon-silicon bond for 193-nm light exposure in a pendant structure, and which is crosslinked by an acid or heat.

An organic antireflective coating (BARC) may be formed on the silicon-containing resist underlayer film. In this case, a pattern can be formed in a body to be processed through the steps of: forming an organic film by using the inventive coating-type composition for forming an organic film on a body to be processed;

forming a silicon-containing resist underlayer film by using a silicon-containing resist underlayer film material on the organic film;

forming an organic antireflective coating (BARC) on the silicon-containing resist underlayer film;

forming a resist upper layer film by using a photoresist composition on the organic antireflective coating so that a 4-layered film structure is constructed;

forming a circuit pattern in the resist upper layer film;

transferring the pattern to the organic antireflective coating and the silicon-containing resist underlayer film by etching the organic antireflective coating and the silicon-containing resist underlayer film while using the resist upper layer film having the formed pattern as a mask;

transferring the pattern to the organic film by etching the organic film while using the silicon-containing resist underlayer film having the transferred pattern as a mask; and forming the pattern on the body to be processed by etching the body to be processed while using the organic film having the transferred pattern as a mask.

Alternatively, an inorganic hard mask may be formed as the resist underlayer film. In this case, a pattern can be formed in a body to be processed through the steps of:

forming an organic film by using the inventive coating-type composition for forming an organic film on a body to be processed;

forming an inorganic hard mask selected from a silicon oxide film, a silicon nitride film, and a silicon oxynitride film on the organic film;

forming a resist upper layer film by using a photoresist composition on the inorganic hard mask; forming a circuit pattern in the resist upper layer film;

transferring the pattern to the inorganic hard mask by etching the inorganic hard mask while using the resist upper layer film having the formed pattern as a mask;

transferring the pattern to the organic film by etching the organic film while using the inorganic hard mask having the transferred pattern as a mask; and forming the pattern on the body to be processed by etching the body to be processed while using the organic film having the transferred pattern as a mask.

In the case where an inorganic hard mask is formed on the organic film as described above, a silicon oxide film, a silicon nitride film, and a silicon oxynitride film (SiON film) can be formed by a CVD method, an ALD method, or the like, for example. The method for forming the silicon nitride film is disclosed in, for example, JP 2002-334869 A and WO 2004/066377 A1. The film thickness of the inorganic hard mask is preferably 5 to 200 nm, more preferably 10 to 100 nm. As the inorganic hard mask, a SiON film is most preferably used which is effective as an antireflective coating. When the SiON film is formed, the substrate temperature reaches 300 to 500° C. Hence, the underlayer film needs to withstand the temperature of 300 to 500° C. Since the compositions for forming an organic film used in the present invention have high heat-resistance and can withstand high temperatures of 300° C. to 500° C., the combination of the inorganic hard mask formed by a CVD method or an ALD method with the organic film formed by a spin-coating method can be achieved.

Moreover, the present invention is suitable for a 4-layer resist process using BARC. In this case, a pattern can be formed in a body to be processed through the steps of:

forming an organic film by using the inventive coating-type composition for forming an organic film on a body to be processed;

forming an inorganic hard mask selected from a silicon oxide film, a silicon nitride film, and a silicon oxynitride film on the organic film;

forming an organic antireflective coating on the inorganic hard mask;

forming a resist upper layer film by using a photoresist composition on the organic antireflective coating, so that a 4-layered film structure is constructed;

forming a circuit pattern in the resist upper layer film;

transferring the pattern to the organic antireflective coating and the inorganic hard mask by etching the organic antireflective coating and the inorganic hard mask while using the resist upper layer film having the formed pattern as a mask;

transferring the pattern to the organic film by etching the organic film while using the inorganic hard mask having the formed pattern as a mask; and forming the pattern on the body to be processed by etching the body to be processed while using the organic film having the formed pattern as a mask.

Although a photoresist film may be formed as a resist upper layer film on an inorganic hard mask, it is also possible to form a BARC on the inorganic hard mask by spin-coating and then form the photoresist film on the BARC as described above. Particularly, when a SiON film is used as the inorganic hard mask, two layers of antireflective coatings including the SiON film and the BARC make it possible to suppress the reflection even in liquid immersion exposure at a high NA exceeding 1.0. Another advantage of the BARC formation is having an effect of reducing trailing of the photoresist pattern immediately above the SiON film.

The resist upper layer film in the 3-layer and 4-layer resist processes may be a positive type or a negative type, and any generally-used photoresist composition can be employed. After spin-coating of the photoresist composition, pre-baking is performed, preferably at 60 to 180° C. for 10 to 300 seconds. Then, light exposure, post-exposure bake (PEB), and development are performed according to conventional methods to obtain the resist pattern. Note that the thickness of the resist upper layer film is not particularly limited, but is preferably 30 to 500 nm, particularly preferably 50 to 400 nm.

In addition, the exposure light includes high energy beam with a wavelength of 300 nm or less; specifically, excimer laser of 248 nm, 193 nm, or 157 nm, soft X-ray of 3 to 20 nm, electron beam, X-ray, etc.

In the inventive patterning processes, a photolithography using light with a wavelength of 10 nm or more and 300 nm or less, direct lithography with electron beam, nanoimprinting, or a combination thereof is preferably employed as the method for forming the circuit pattern in the resist upper layer film.

Moreover, in the inventive patterning processes, alkali development or organic solvent development is preferably employed as the development method.

Next, while using the resulting resist pattern as a mask, etching is performed. In the 3-layer or 4-layer resist process, the silicon-containing resist underlayer film and the inorganic hard mask are etched by using a fluorocarbon-based gas while using the upper layer resist pattern as the mask. Thereby, a silicon-containing resist underlayer film pattern and an inorganic hard mask pattern are formed.

Next, while using the obtained silicon-containing resist underlayer film pattern and inorganic hard mask pattern as masks, the organic film is processed by etching.

Subsequently, the body to be processed (e.g. substrate to be processed) can be etched according to a conventional method. For example, the substrate to be processed made of $SiO_2$, SiN, or silica-based low-dielectric insulating film is etched mainly with a fluorocarbon-based gas; and p-Si, Al, or W is etched mainly with a chlorine- or bromine-based gas. When the substrate is processed by etching with a fluorocarbon-based gas, the silicon-containing resist underlayer film pattern in the 3-layer or 4-layer resist process is removed when the substrate is processed. When the substrate is etched with a chlorine- or bromine-based gas, the silicon-containing resist underlayer film pattern needs to be removed by additional dry etching with a fluorocarbon-based gas after the substrate processing.

The organic film obtained from the inventive coating-type composition for forming an organic film is characterized by excellent etching resistance when the substrate to be processed is etched as described above.

In the inventive patterning processes, as the body to be processed, it is preferable to use a semiconductor device substrate, a metal film, a metal carbide film, a metal oxide film, a metal nitride film, a metal oxycarbide film, or a metal oxynitride film.

Furthermore, the body to be processed preferably contains silicon, titanium, tungsten, hafnium, zirconium, chromium, germanium, copper, silver, gold, aluminum, indium, gallium, arsenic, palladium, iron, tantalum, iridium, molybdenum, or an alloy thereof.

Note that the substrate to be processed is not particularly limited, and examples thereof include substrates made of Si, α-Si, p-Si, $SiO_2$, SiN, SiON, W, TiN, Al, or the like; these substrates coated with a layer to be processed; etc. Examples of the layer to be processed include various Low-k films made of Si, $SiO_2$, ZiON, SiN, p-Si, α-Si, W, W—Si, Al, Cu, Al—Si, or the like; and stopper films thereof. Generally, the layer can be formed to have a thickness of preferably 50 to 10,000 nm, more preferably 100 to 5,000 nm. Note that when the layer to be processed is formed, the substrate and the layer to be processed are formed from different materials.

Furthermore, it is preferable to use the substrate to be processed which has a structure or step with a height of 30 nm or more. An organic film formed by using the inventive coating-type composition for forming an organic film on such a substrate to be processed can exhibit excellent filling property and excellent planarizing property.

Hereinbelow, an example of the 3-layer resist process will be specifically described with reference to FIG. 1.

As shown in FIG. 1(A), in the 3-layer resist process, an organic film 3 is formed by using the inventive composition for forming an organic film on a layer 2 to be processed which has been stacked on a substrate 1. Then, a silicon-containing resist underlayer film 4 is formed, and a resist upper layer film 5 is formed thereon.

Next, as shown in FIG. 1(B), a predetermined portion 6 of the resist upper layer film 5 is exposed to light, followed by PEB and development to form a resist upper layer film pattern 5a (FIG. 1(C)). While using the resulting resist upper layer film pattern 5a as a mask, the silicon-containing resist underlayer film 4 is etched with a CF-based gas. Thereby, a silicon-containing resist underlayer film pattern 4a is formed (FIG. 1(D)). After the resist upper layer film pattern 5a is removed, the organic film 3 is etched with oxygen plasma while using the resulting silicon-containing resist underlayer film pattern 4a as a mask. Thereby, an organic film pattern 3a is formed (FIG. 1(E)). Further, after the silicon-containing resist underlayer film pattern 4a is removed, the layer 2 to be processed is etched while using the organic film pattern 3a as a mask. Thus, a pattern 2a is formed in the layer 2 to be processed (FIG. 1(F)).

When an inorganic hard mask is used, the inorganic hard mask is used in place of the silicon-containing resist underlayer film 4. When a BARC is formed, the BARC layer is disposed between the silicon-containing resist underlayer film 4 or the inorganic hard mask and the resist upper layer film 5. The etching of the BARC starts before the etching of the silicon-containing resist underlayer film 4, but these etchings may be performed continuously. Alternatively, after the BARC is etched alone, for example, the etching apparatus is changed, and then the etching of the silicon-containing resist underlayer film 4 may be started.

As described above, the inventive patterning processes make it possible to precisely form a fine pattern in a body to be processed in the multilayer resist processes.

EXAMPLE

Hereinafter, the present invention will be more specifically described by referring to Synthesis Examples, Comparative Synthesis Examples, Examples, and Comparative Examples. However, the present invention is not limited thereto. Note that, with respect to molecular weight and dispersity, weight-average molecular weight (Mw) and number-average molecular weight (Mn) were measured by gel permeation chromatography (GPC) using tetrahydrofuran as an eluent in terms of polystyrene, and dispersity (Mw/Mn) was calculated therefrom.

Polymers (A1) to (A17) contained in the compositions for forming an organic film described below were synthesized using the following fluorenols (B1) to (B10) and the following aromatic-group-containing compounds (C1) to (C5).

Fluorenols:

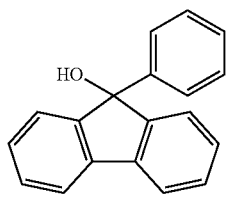
(B1)

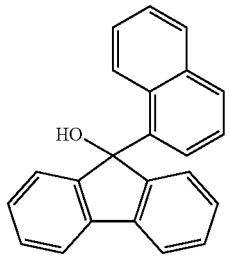
(B2)

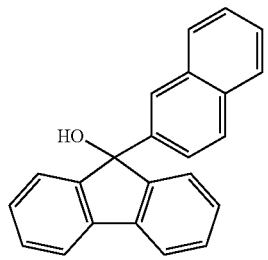
(B3)

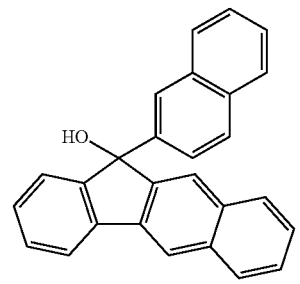
(B4)

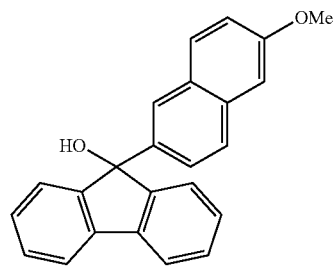
(B5)

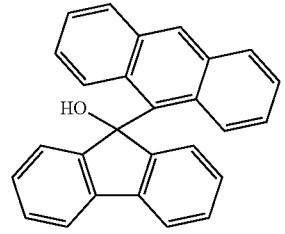
(B6)

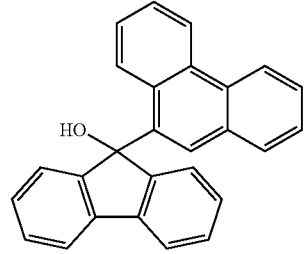
(B7)

(B8)

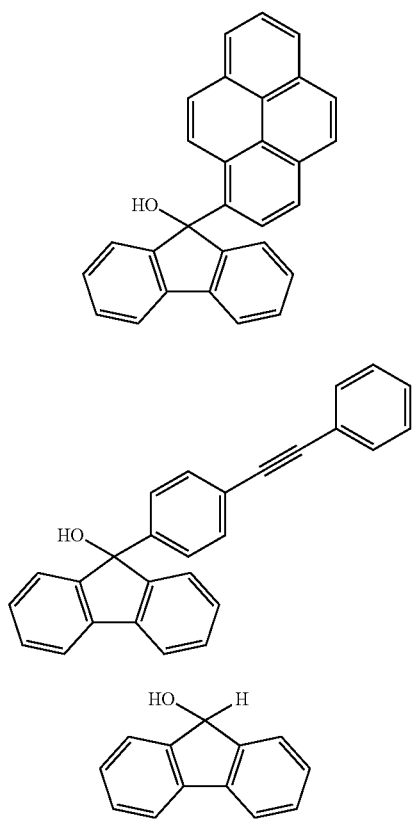

(B9)

(B10)

Aromatic-group-containing compounds:

(C1)

(C2)

(C3)

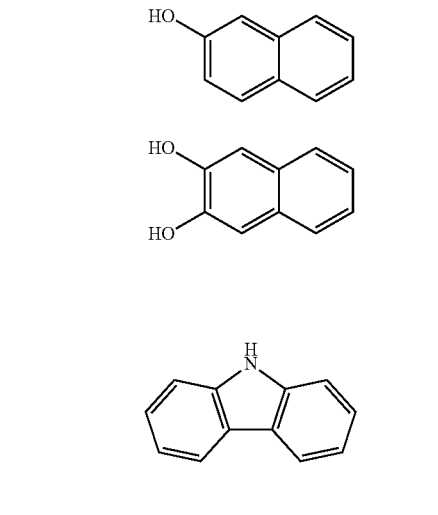

(C4)

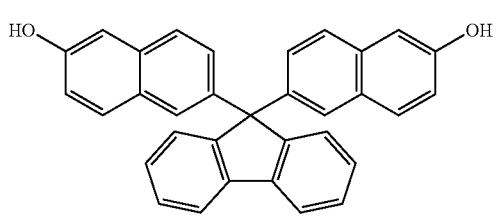

(C5)

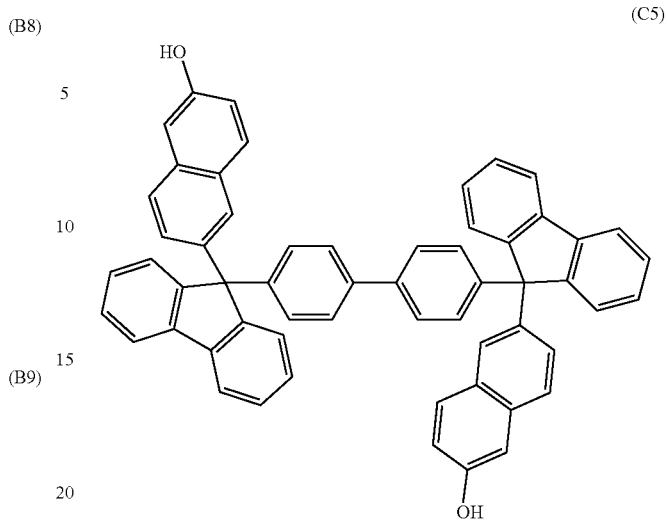

When a plurality of fluorenols were used to synthesize a polymer, the charging proportions of the fluorenols were described using "m" and "l" as in the following formulae.

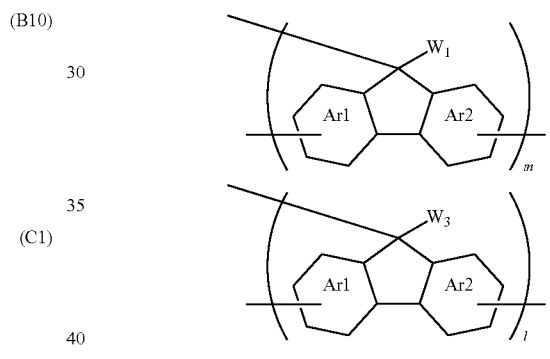

Synthesis Examples: Synthesis of Etching Resistance Organic Compounds

[Synthesis Example 1] Synthesis of Polymer (A1)

(A1)

54.5 g of fluorenol (B1) and 200 g of 1,2-dichloroethane were mixed and the temperature was raised to 50° C. 20.3 g of methanesulfonic acid was slowly added dropwise, and the mixture was heated and stirred at 70° C. for 6 hours. After cooling to room temperature, 650 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 600 g of methanol. The precipitated crystal was separated by filtration, washed twice with 200 g of methanol, and collected. The collected crystal was vacuum-dried at 70° C. Thus, 60.7 g of polymer (A1) was obtained.

When the weight-average molecular weight (Mw) and dispersity (Mw/Mn) were measured by GPC, the following results were obtained.

(A1): Mw=2700,Mw/Mn=1.39

[Synthesis Example 2] Synthesis of Polymer (A2)

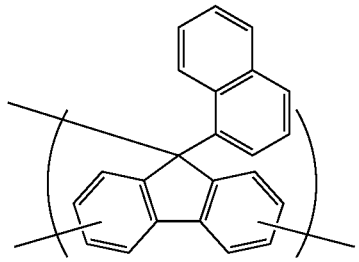

(A2)

61.7 g of fluorenol (B2) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 600 g of methanol. The precipitated crystal was separated by filtration, washed twice with 200 g of methanol, and collected. The collected crystal was vacuum-dried at 70° C. Thus, 56.7 g of polymer (A2) was obtained.

When the weight-average molecular weight (Mw) and dispersity (Mw/Mn) were measured by GPC, the following results were obtained.

(A2): Mw=2780,Mw/Mn=1.35

[Synthesis Example 3] Synthesis of Polymer (A3)

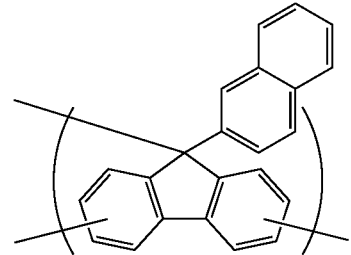

(A3)

61.7 g of fluorenol (B3) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 600 g of methanol. The precipitated crystal was separated by filtration, washed twice with 200 g of methanol, and collected. The collected crystal was vacuum-dried at 70° C. Thus, 57.5 g of polymer (A3) was obtained.

When the weight-average molecular weight (Mw) and dispersity (Mw/Mn) were measured by GPC, the following results were obtained.

(A3): Mw=2810,Mw/Mn=1.36

[Synthesis Example 4] Synthesis of Polymer (A4)

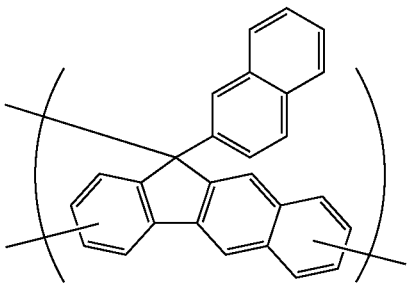

(A4)

71.7 g of fluorenol (B4) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 680 g of methanol. The precipitated crystal was separated by filtration, washed twice with 200 g of methanol, and collected. The collected crystal was vacuum-dried at 70° C. Thus, 68.1 g of polymer (A4) was obtained.

When the weight-average molecular weight (Mw) and dispersity (Mw/Mn) were measured by GPC, the following results were obtained.

(A4): Mw=2900,Mw/Mn=1.38

[Synthesis Example 5] Synthesis of Polymer (A5)

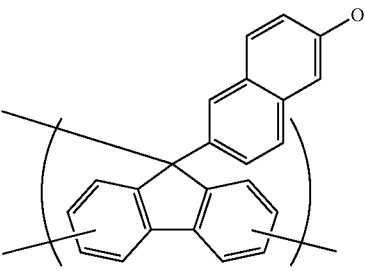

(A5)

67.7 g of fluorenol (B5) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 650 g of methanol. The precipitated crystal was separated by filtration, washed twice with 200 g of methanol, and collected. The collected crystal was vacuum-dried at 70° C. Thus, 64.0 g of polymer (A5) was obtained.

When the weight-average molecular weight (Mw) and dispersity (Mw/Mn) were measured by GPC, the following results were obtained.

(A5): Mw=2950,Mw/Mn1.40

[Synthesis Example 6] Synthesis of Polymer (A6)

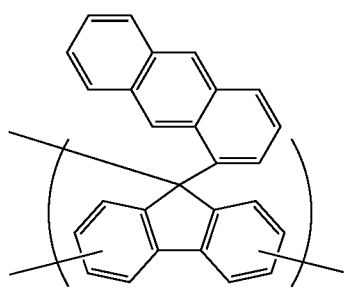

(A6)

71.7 g of fluorenol (B6) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THE was added to form a homogeneous solution. Thereafter, a crystal was precipitated in 600 g of methanol. The precipitated crystal was separated by filtration, washed twice with 200 g of methanol, and collected. The collected crystal was vacuum-dried at 70° C. Thus, 68.0 g of polymer (A6) was obtained.

When the weight-average molecular weight (Mw) and dispersity (Mw/Mn) were measured by GPC, the following results were obtained.

(A6): Mw=2890,Mw/Mn=1.39

[Synthesis Example 7] Synthesis of Polymer (A7)

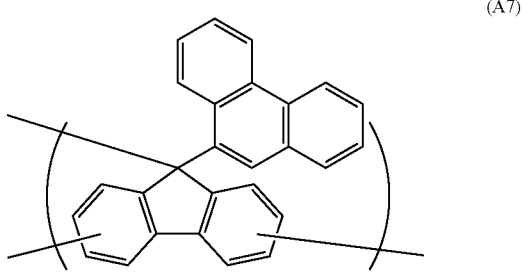

(A7)

71.7 g of fluorenol (B7) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 680 g of methanol. The precipitated crystal was separated by filtration, washed twice with 200 g of methanol, and collected. The collected crystal was vacuum-dried at 70° C. Thus, 68.0 g of polymer (A7) was obtained.

When the weight-average molecular weight (Mw) and dispersity (Mw/Mn) were measured by GPC, the following results were obtained.

(A7): Mw=2870,Mw/Mn=1.38

[Synthesis Example 8] Synthesis of Polymer (A8)

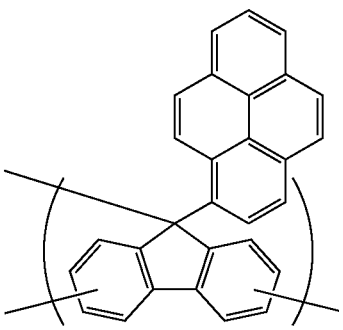

(A8)

76.5 g of fluorenol (B8) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 700 g of methanol. The precipitated crystal was separated by filtration, washed twice with 200 g of methanol, and collected. The collected crystal was vacuum-dried at 70° C. Thus, 72.8 g of polymer (A8) was obtained.

When the weight-average molecular weight (Mw) and dispersity (Mw/Mn) were measured by GPC, the following results were obtained.

(A8): Mw=2920,Mw/Mn=1.41

[Synthesis Example 9] Synthesis of Polymer (A9)

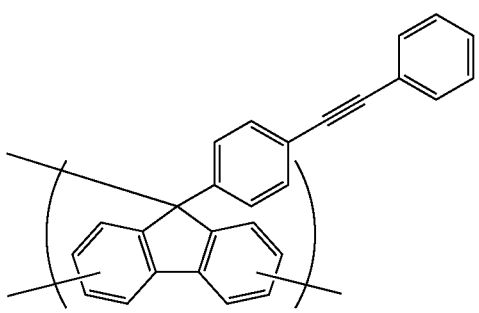

(A9)

71.7 g of fluorenol (B9) and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 680 g of methanol. The precipitated crystal was separated by filtration, washed twice with 200 g of methanol, and collected. The collected crystal was vacuum-dried at 70° C. Thus, 68.1 g of polymer (A9) was obtained.

When the weight-average molecular weight (Mw) and dispersity (Mw/Mn) were measured by GPC, the following results were obtained.

(A9): Mw=2890,Mw/Mn=1.38

[Synthesis Example 10] Synthesis of Polymer (A10)

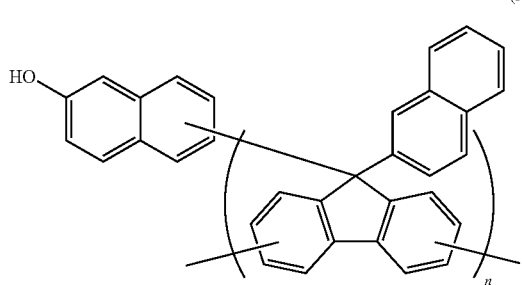

(A10)

9.2 g of fluorenol (B3), 0.5 g of aromatic-group-containing compound (C1), and 50 g of methylene chloride were mixed. 3.2 g of methanesulfonic acid was slowly added dropwise, and the mixture was heated under reflux for 17 hours. After cooling to room temperature, 100 g of methyl isobutyl ketone was added, the resultant was washed six times with 50 g of pure water, and the organic layer was evaporated under reduced pressure to dryness. To the residue, 20 g of THF was added to form a homogeneous solution. Thereafter, a crystal was precipitated in 90 g of methanol. The precipitated crystal was separated by filtration, washed twice with 20 g of methanol, and collected. The collected crystal was vacuum-dried at 70° C. Thus, 8.6 g of polymer (A10) was obtained.

When the weight-average molecular weight (Mw) and dispersity (Mw/Mn) were measured by GPC, the following results were obtained.

(A10):Mw=1520,Mw/Mn=1.25

[Synthesis Example 11] Synthesis of Polymer (A11)

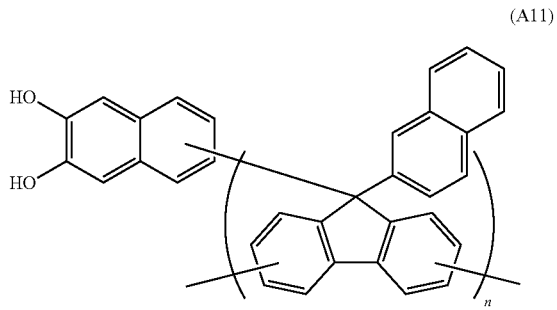

(A11)

9.2 g of fluorenol (B3), 0.5 g of aromatic-group-containing compound (C2), and 50 g of methylene chloride were mixed. 3.2 g of methanesulfonic acid was slowly added dropwise, and the mixture was heated under reflux for 17 hours. After cooling to room temperature, 100 g of methyl isobutyl ketone was added, the resultant was washed six times with 50 g of pure water, and the organic layer was evaporated under reduced pressure to dryness. To the residue, 20 g of THE was added to form a homogeneous solution. Thereafter, a crystal was precipitated in 90 g of methanol. The precipitated crystal was separated by filtration, washed twice with 20 g of methanol, and collected. The collected crystal was vacuum-dried at 70° C. Thus, 9.0 g of polymer (A11) was obtained.

When the weight-average molecular weight (Mw) and dispersity (Mw/Mn) were measured by GPC, the following results were obtained.

(A11): Mw=1630,Mw/Mn=1.22

[Synthesis Example 12] Synthesis of Polymer (A12)

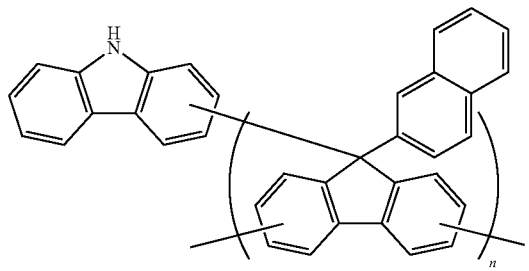
(A12)

61.7 g of fluorenol (B3), 4.2 g of aromatic-group-containing compound (C3), and 160 g of methylene chloride were mixed. 21.6 g of methanesulfonic acid was slowly added dropwise, and the mixture was heated under reflux for 18 hours. After cooling to room temperature, 300 g of methyl isobutyl ketone was added, the resultant was washed six times with 100 g of pure water, and the organic layer was evaporated under reduced pressure to dryness. To the residue, 200 g of THF was added to form a homogeneous solution. Thereafter, a crystal was precipitated in 650 g of methanol. The precipitated crystal was separated by filtration, washed twice with 200 g of methanol, and collected. The collected crystal was vacuum-dried at 70° C. Thus, 62.2 g of polymer (A12) was obtained.

When the weight-average molecular weight (Mw) and dispersity (Mw/Mn) were measured by GPC, the following results were obtained.

(A12): Mw=1420,Mw/Mn=1.19

[Synthesis Example 13] Synthesis of Polymer (A13)

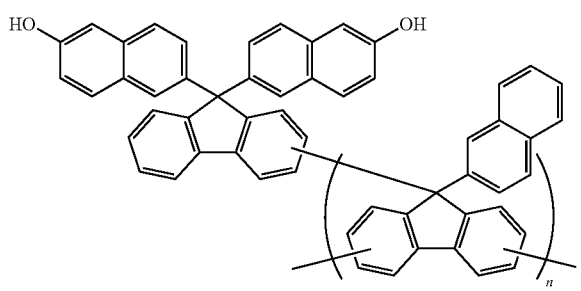
(A13)

61.7 g of fluorenol (B3), 11.3 g of aromatic-group-containing compound (C4), and 160 g of methylene chloride were mixed. 21.6 g of methanesulfonic acid was slowly added dropwise, and the mixture was heated under reflux for 18 hours. After cooling to room temperature, 300 g of methyl isobutyl ketone was added, the resultant was washed six times with 100 g of pure water, and the organic layer was evaporated under reduced pressure to dryness. To the residue, 200 g of THF was added to form a homogeneous solution. Thereafter, a crystal was precipitated in 700 g of methanol. The precipitated crystal was separated by filtration, washed twice with 200 g of methanol, and collected. The collected crystal was vacuum-dried at 70° C. Thus, 69.3 g of polymer (A13) was obtained.

When the weight-average molecular weight (Mw) and dispersity (Mw/Mn) were measured by GPC, the following results were obtained.

(A13): Mw=2020,Mw/Mn=1.24

[Synthesis Example 14] Synthesis of Polymer (A14)

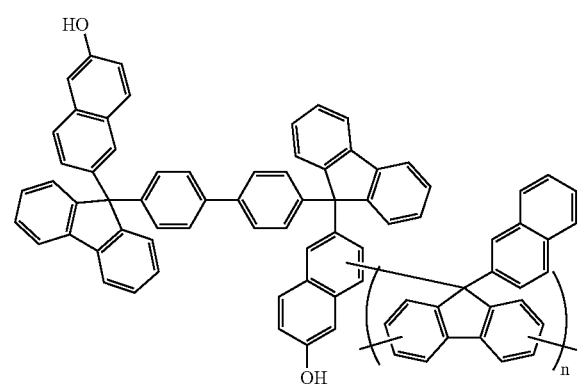
(A14)

61.7 g of fluorenol (B3), 19.2 g of aromatic-group-containing compound (C5), and 160 g of methylene chloride were mixed. 21.6 g of methanesulfonic acid was slowly added dropwise, and the mixture was heated under reflux for 18 hours. After cooling to room temperature, 300 g of methyl isobutyl ketone was added, the resultant was washed six times with 100 g of pure water, and the organic layer was evaporated under reduced pressure to dryness. To the residue, 200 g of THF was added to form a homogeneous solution. Thereafter, a crystal was precipitated in 800 g of methanol. The precipitated crystal was separated by filtration, washed twice with 200 g of methanol, and collected. The collected crystal was vacuum-dried at 70° C. Thus, 77.2 g of polymer (A14) was obtained.

When the weight-average molecular weight (Mw) and dispersity (Mw/Mn) were measured by GPC, the following results were obtained.

(A14): Mw=2200,Mw/Mn=1.27

[Synthesis Example 15] Synthesis of Polymer (A15)

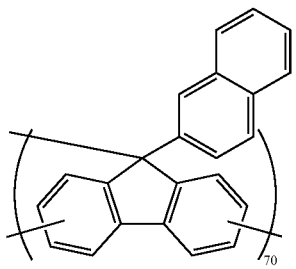
(A15)

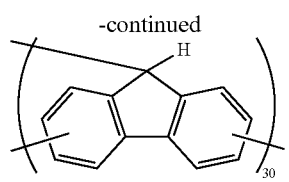

43.2 g of fluorenol (B3), 10.9 g of fluorenol (B10), and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 150 g of THF was added to form a homogeneous solution. Thereafter, a crystal was precipitated in 500 g of methanol. The precipitated crystal was separated by filtration, washed twice with 200 g of methanol, and collected. The collected crystal was vacuum-dried at 70° C. Thus, 52.5 g of polymer (A15) was obtained.

When the weight-average molecular weight (Mw) and dispersity (Mw/Mn) were measured by GPC, the following results were obtained.

(A15): Mw=2890,Mw/Mn=1.60

[Synthesis Example 16] Synthesis of Polymer (A16)

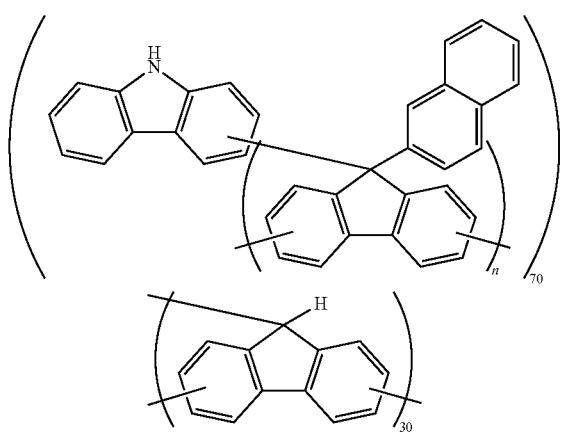

38.4 g of fluorenol (B3), 2.6 g of aromatic-group-containing compound (C3), 10.9 g of fluorenol (B10), and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 150 g of THF was added to form a homogeneous solution. Thereafter, a crystal was precipitated in 500 g of methanol. The precipitated crystal was separated by filtration, washed twice with 200 g of methanol, and collected. The collected crystal was vacuum-dried at 70° C. Thus, 50.5 g of polymer (A16) was obtained.

When the weight-average molecular weight (Mw) and dispersity (Mw/Mn) were measured by GPC, the following results were obtained.

(A16): Mw=1520,Mw/Mn=1.24

[Synthesis Example 17] Synthesis of Polymer (A17)

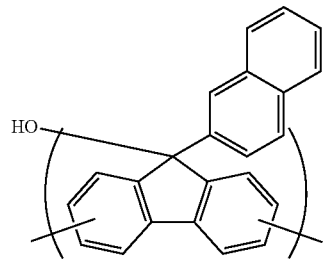

61.7 g of fluorenol (B3), 0.36 g of water, and 160 g of methylene chloride were mixed. 19.2 g of methanesulfonic acid was slowly added dropwise, and the mixture was heated under reflux for 8 hours. After cooling to room temperature, 250 g of toluene was added, the resultant was washed six times with 100 g of pure water, and the organic layer was evaporated under reduced pressure to dryness. To the residue, 200 g of THF was added to form a homogeneous solution. Thereafter, a crystal was precipitated in 600 g of methanol. The precipitated crystal was separated by filtration, washed twice with 200 g of methanol, and collected. The collected crystal was vacuum-dried at 70° C. Thus, 57.5 g of polymer (A17) was obtained.

When the weight-average molecular weight (Mw) and dispersity (Mw/Mn) were measured by GPC, the following results were obtained.

(A17): Mw=1850,Mw/Mn=1.26

Synthesis Examples: Synthesis of Tertiary-Alcohol-Based Crosslinking Agent

[Synthesis Example 18] Synthesis of Compound (A18)

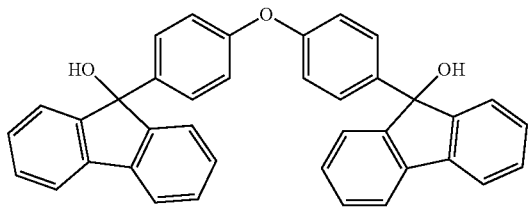

To a mixed solution of 219 g of bis(4-bromophenyl)ether and 1000 mL of t-butylmethyl ether cooled to −20° C. under an $N_2$ atmosphere, 500 mL of a 2.67 M solution of n-butyl lithium in hexane was added, and the mixture was stirred at −20° C. for 20 minutes. 229 g of 9-fluorenone was added, the temperature was gradually raised to room temperature, and the solution was stirred at room temperature for 4 hours. The reaction was stopped by adding water. After washing with water and concentrating under reduced pressure, hexane was added, and the generated solid was collected by filtration, washed with hexane, and dried under reduced pressure. Thus, 293 g of diol (A18) was obtained.

IR (D-ATR): ν=3440, 3066, 3039, 1595, 1496, 1448, 1212, 1164, 1038, 1032, 923, 822, 767, 751, 732 cm$^{-1}$.

$^1$H-NMR (600 MHz in DMSO-d6): δ=6.29 (2H, —OH, s), 6.83 (4H, d), 7.20-7.25 (12H, m), 7.33-7.36 (4H, m), 7.79 (4H, d) ppm.

Comparative Synthesis Examples: Synthesis of Curable Organic Compounds

[Comparative Synthesis Example 1] Synthesis of Polymer (R1)

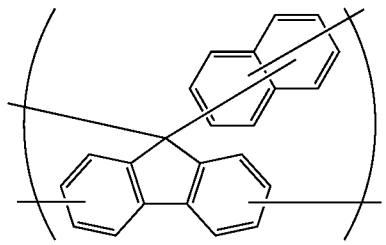

(R1)

12.8 g of naphthalene and 18.0 g of 9-fluorenone were mixed, the temperature was raised to 230° C., and reaction was allowed to proceed for 8 hours. Immediately after the reaction started, 0.25 ml of methanesulfonic acid was added to the reaction solution once every hour, i.e., eight times in total. After cooling to room temperature, 40 g of toluene and 20 g of anisole were added, the resultant was washed six times with pure water, and the organic layer was evaporated under reduced pressure to dryness. To the residue, 100 g of THF (tetrahydrofuran) was added to form a homogeneous solution. Thereafter, a crystal was precipitated in 300 g of methanol. The precipitated crystal was separated by filtration, washed twice with 200 g of methanol, and collected. The collected crystal was vacuum-dried at 70° C. Thus, 20.0 g of polymer (R1) was obtained.

When the weight-average molecular weight (Mw) and dispersity (Mw/Mn) were measured by GPC, the following results were obtained.

(R1): Mw=2130, Mw/Mn=2.61

[Comparative Synthesis Example 2] Synthesis of Compound (R2)

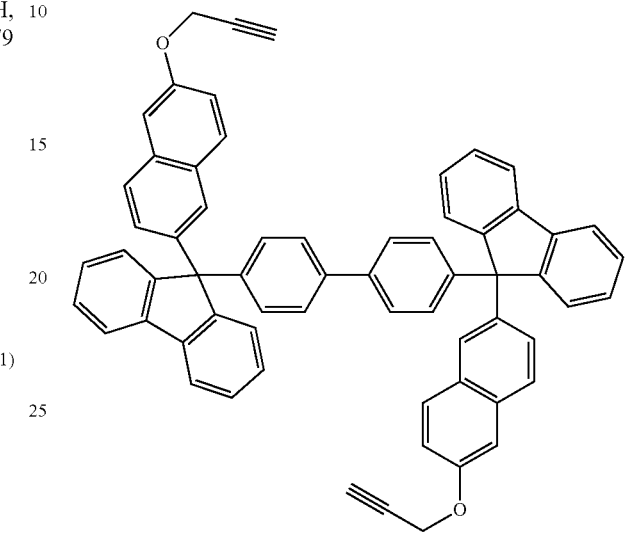

(R2)

7.7 g of aromatic-group-containing compound (C5), 3.0 g of potassium carbonate, and 40 g of N,N-dimethylformamide were mixed, and the temperature was raised to 55° C. 3.3 g of an 80% solution of propargyl bromide in toluene was slowly added dropwise, and the resultant was heated and stirred at 55° C. for 14 hours. After cooling to room temperature, 150 g of toluene was added, and the resultant was washed with water and concentrated under reduced pressure. Thus, 8.4 g of propargyl (R2) was obtained.

When the weight-average molecular weight (Mw) and dispersity (Mw/Mn) were measured by GPC, the following results were obtained.

(R2): Mw=966, Mw/Mn=1.09

Preparation of Compositions (UDL-1 to -20, Comparative UDL-1 to -3) for Forming Organic Film One of the polymers (A1) to (A17), polymer (R1), and compound (R2) and (A18) or (XL1) as a crosslinking agent were dissolved in a solvent containing 0.05 mass % of an acid generator (AG1) and 0.1 mass % of a surfactant FC-4430 (manufactured by Sumitomo 3M Ltd.) in proportions shown in Tables 1 and 2. The solution was filtered through a 0.1-μm filter made of a fluorinated resin to prepare coating-type compositions (materials) (UDL-1 to -20, comparative UDL-1 to 3) for forming an organic film. As solvents, propylene glycol monomethyl ether acetate (PGMEA), cyclohexanone (CyHO), and/or 1,2,4-trimethylbenzene (TMB) were used in proportions shown in Tables 1 and 2. Note that a crosslinking agent was not contained in UDL-19, comparative UDL-1, and comparative UDL-3.

TABLE 1

| Composition for forming organic film | Polymer (parts by mass) | Additives (parts by mass) | Solvent (parts by mass) |
|---|---|---|---|
| UDL-1 | A1 (7) | A18 (3) AG1 (0.05) FC-4430 (0.1) | PGMEA (90) |
| UDL-2 | A2 (7) | A18 (3) AG1 (0.05) FC-4430 (0.1) | PGMEA (90) |
| UDL-3 | A3 (7) | A18 (3) AG1 (0.05) FC-4430 (0.1) | PGMEA (60) CyHO (30) |
| UDL-4 | A3 (7) | A18 (3) AG1 (0.05) FC-4430 (0.1) | PGMEA (35) CyHO (10) TMB (45) |
| UDL-5 | A4 (7) | A18 (3) AG1 (0.05) FC-4430 (0.1) | PGMEA (60) CyHO (30) |
| UDL-6 | A5 (7) | A18 (3) AG1 (0.05) FC-4430 (0.1) | PGMEA (60) CyHO (30) |
| UDL-7 | A6 (7) | A18 (3) AG1 (0.05) FC-4430 (0.1) | PGMEA (60) CyHO (30) |
| UDL-8 | A7 (7) | A18 (3) AG1 (0.05) FC-4430 (0.1) | PGMEA (60) CyHO (30) |
| UDL-9 | A8 (7) | A18 (3) AG1 (0.05) FC-4430 (0.1) | PGMEA (60) CyHO (30) |
| UDL-10 | A9 (7) | A18 (3) AG1 (0.05) FC-4430 (0.1) | PGMEA (60) CyHO (30) |

TABLE 2

| Composition for forming organic film | Polymer (parts by mass) | Additives (parts by mass) | Solvent (parts by mass) |
|---|---|---|---|
| UDL-11 | A10 (7) | A18 (3) AG1 (0.05) FC-4430 (0.1) | PGMEA (60) CyHO (30) |
| UDL-12 | A11 (7) | A18 (3) AG1 (0.05) FC-4430 (0.1) | PGMEA (90) |
| UDL-13 | A12 (7) | A18 (3) AG1 (0.05) FC-4430 (0.1) | PGMEA (90) |
| UDL-14 | A12 (7) | XL1 (3) AG1 (0.05) FC-4430 (0.1) | PGMEA (90) |
| UDL-15 | A13 (7) | A18 (3) AG1 (0.05) FC-4430 (0.1) | PGMEA (90) |
| UDL-16 | A14 (7) | A18 (3) AG1 (0.05) FC-4430 (0.1) | PGMEA (90) |
| UDL-17 | A15 (7) | A18 (3) AG1 (0.05) FC-4430 (0.1) | PGMEA (90) |
| UDL-18 | A16 (7) | A18 (3) AG1 (0.05) BC-4430 (0.1) | PGMEA (90) |
| UDL-19 | A17 (10) | FC-4430 (0.1) | PGMEA (60) CyHO (30) |
| UDL-20 | A17 (7) | A18 (3) AG1 (0.05) FC-4430 (0.1) | PGMEA (60) CyHO (30) |
| Comparative UDL-1 | R1 (10) | FC-4430 (0.1) | CyHO (90) |
| Comparative UDL-2 | R1 (7) | A18 (3) AG1 (0.05) FC-4430 (0.1) | CyHO (90) |
| Comparative UDL-3 | R2 (10) | FC-4430 (0.1) | PGMEA (90) |

The acid generator (AG1) and the crosslinking agent (XL1) are shown below.

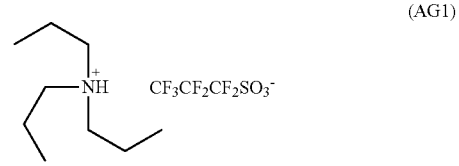

(AG1)

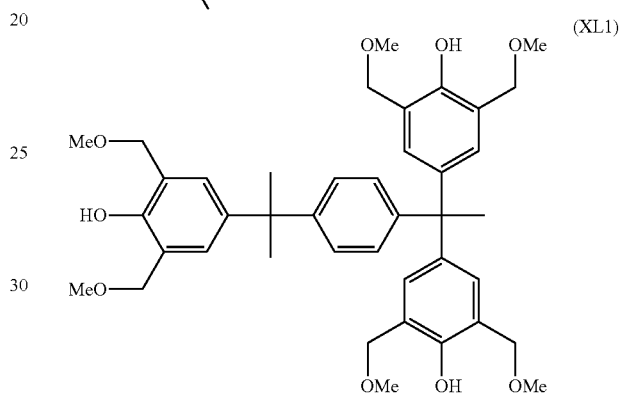

(XL1)

Example 1: Solvent Resistance Measurement
(Examples 1-1 to 1-20, Comparative Examples 1-1 to 1-3)

The compositions (UDL-1 to -20, comparative UDL-1 to -3) for forming an organic film prepared above were applied onto a silicon substrate and baked in the atmosphere at 350° C. for 60 seconds. Then, the film thickness was measured. Subsequently, a PGMEA solvent was dispensed on the coating film and allowed to stand for 30 seconds. The resultant was spin-dried and baked at 100° C. for 60 seconds to evaporate the PGMEA (PGMEA treatment). After the treatment, the film thickness was measured. The difference in the film thicknesses before and after the PGMEA treatment was determined as the ratio of the film thickness "b" after the treatment to the film thickness "a" before the treatment (film remaining percentage). Table 3 shows the results.

TABLE 3

| Composition for forming organic film | Film thickness after film formation: a (Å) | Film thickness after PGMEA treatment: b (Å) | Film remaining percentage b/a × 100 (%) |
|---|---|---|---|
| Example 1-1 | UDL-1 | 1155 | 1153 | 99.8 |
| Example 1-2 | UDL-2 | 1155 | 1154 | 99.9 |
| Example 1-3 | UDL-3 | 1153 | 1152 | 99.9 |
| Example 1-4 | UDL-4 | 1152 | 1151 | 99.9 |
| Example 1-5 | UDL-5 | 1156 | 1155 | 99.9 |

TABLE 3-continued

| | Composition for forming organic film | Film thickness after film formation: a (Å) | Film thickness after PGMEA treatment: b (Å) | Film remaining percentage b/a × 100 (%) |
|---|---|---|---|---|
| Example 1-6 | UDL-6 | 1153 | 1152 | 99.9 |
| Example 1-7 | UDL-7 | 1154 | 1153 | 99.9 |
| Example 1-8 | UDL-8 | 1157 | 1156 | 99.9 |
| Example 1-9 | UDL-9 | 1157 | 1156 | 99.9 |
| Example 1-10 | UDL-10 | 1158 | 1157 | 99.9 |
| Example 1-11 | UDL-11 | 1156 | 1155 | 99.9 |
| Example 1-12 | UDL-12 | 1151 | 1150 | 99.9 |
| Example 1-13 | UDL-13 | 1153 | 1152 | 99.9 |
| Example 1-14 | UDL-14 | 1157 | 1156 | 99.9 |
| Example 1-15 | UDL-15 | 1157 | 1156 | 99.9 |
| Example 1-16 | UDL-16 | 1158 | 1157 | 99.9 |
| Example 1-17 | UDL-17 | 1157 | 1156 | 99.9 |
| Example 1-18 | UDL-18 | 1151 | 1150 | 99.9 |
| Example 1-19 | UDL-19 | 1154 | 1153 | 99.9 |
| Example 1-20 | UDL-20 | 1158 | 1157 | 99.9 |
| Comparative Example 1-1 | Comparative UDL-1 | 1155 | 792 | 68.6 |
| Comparative Example 1-2 | Comparative UDL-2 | 1154 | 1153 | 99.9 |
| Comparative Example 1-3 | Comparative UDL-3 | 1148 | 1146 | 99.8 |

As shown in Table 3, in the inventive compositions for forming an organic film (Examples 1-1 to 1-20), the film remaining percentages after the PGMEA treatment were 99% or more. This indicates that a crosslinking reaction was performed by the heat treatment, and sufficient solvent resistance was exhibited. In particular, as clearly seen from comparison of Example 1-19 and Example 1-20, the inventive composition for forming an organic film can exhibit sufficient solvent resistance even when a crosslinking agent is not contained. In contrast, as clearly seen from comparison of Comparative Example 1-1 and Comparative Example 1-2, comparative UDL-1 using the polymer (R1) had no crosslinkable moiety and did not exhibit solvent resistance with the polymer alone. In order for solvent resistance to be exhibited, the acid generator and the crosslinking agent needed to be added. These results indicate that an organic film formed by using the inventive polymer synthesized by the inventive manufacturing method exhibits more sufficient solvent resistance than the polymer (R1) whose carbon atom in the top position of the fluorene skeleton in the repeating unit has two polymerization points. Note that it can be conjectured that the comparative UDL-3 used in Comparative Example 1-3 exhibited sufficient solvent resistance since the compound (R2), having a triple bond at the terminals, was contained, and crosslinking took place due to the heat treatment.

Example 2: Etching Test with $CF_4/CHF_3$-based Gas (Examples 2-1 to 2-20, Comparative Example 2-1)

The compositions (UDL-1 to 20, comparative UDL-3) for forming an organic film were each applied onto a silicon wafer substrate and baked in the atmosphere at 350° C. for 60 seconds. An organic film of 115 nm each was formed, and an etching test was conducted with a $CF_4/CHF_3$-based gas under the following conditions. In this case, an etching apparatus Telius manufactured by Tokyo Electron Limited was used to find the film thickness difference of the organic films before and after the etching. Table 4 also shows the results.

The etching conditions were as follows.
Chamber pressure: 40.0 Pa
RF power: 1,000 W
$CF_4$ gas flow rate: 100 sccm
$CHF_3$ gas flow rate: 10 sccm
He gas flow rate: 200 sccm
Time: 20 sec Table 4 shows the film reduction ratio in each Example and Comparative Example, given that the thickness of the film in Comparative Example 2-1 reduced by the etching with $CF_4/CHF_3$-based gas is Taken as 100. A smaller ratio indicates a more excellent etching resistance.

Example 3: Etching Test with $O_2$-based Gas (Examples 3-1 to 3-20, Comparative Example 3-1)

In the same manner as in the etching test with the $CF_4/CHF_3$-based gas, the compositions (UDL-1 to -20, comparative UDL-3) for forming an organic film were each applied onto a silicon substrate and baked in the atmosphere at 350° C. for 60 seconds. An organic film of 115 nm each was formed, and an etching test was conducted with an $O_2$-based gas under the following conditions. In this case, an etching apparatus Telius manufactured by Tokyo Electron Limited was used to find the film thickness difference of the organic films before and after the etching. Table 4 also shows the results.

The etching conditions were as follows.
Chamber pressure: 40.0 Pa
RF power: 100 W
$O_2$ gas flow rate: 30 sccm
$N_2$ gas flow rate: 70 sccm
Time: 20 sec In the same manner, Table 4 shows the film reduction ratio in each Example and Comparative Example, given that the thickness of the film in Comparative Example 3-1 reduced by the etching with 02-based gas is taken as 100. A smaller ratio indicates a more excellent etching resistance.

TABLE 4

| | | $CF_4/CHF_3$-based gas | | | $O_2$-based gas | |
|---|---|---|---|---|---|---|
| Composition for forming organic film | | Film reduction amount (Å) | Film reduction ratio (%) | | Film reduction amount (Å) | Film reduction ratio (%) |
| UDL-1 | Example 2-1 | 203 | 93 | Example 3-1 | 300 | 93 |
| UDL-2 | Example 2-2 | 206 | 95 | Example 3-2 | 303 | 95 |
| UDL-3 | Example 2-3 | 202 | 92 | Example 3-3 | 298 | 93 |
| UDL-4 | Example 2-4 | 196 | 91 | Example 3-4 | 291 | 92 |
| UDL-5 | Example 2-5 | 196 | 91 | Example 3-5 | 291 | 92 |
| UDL-6 | Example 2-6 | 200 | 92 | Example 3-6 | 305 | 93 |

TABLE 4-continued

| Composition for forming organic film | | CF₄/CHF₃-based gas | | | O₂-based gas | |
|---|---|---|---|---|---|---|
| | | Film reduction amount (Å) | Film reduction ratio (%) | | Film reduction amount (Å) | Film reduction ratio (%) |
| UDL-7 | Example 2-7 | 201 | 92 | Example 3-7 | 303 | 93 |
| UDL-8 | Example 2-8 | 200 | 91 | Example 3-8 | 300 | 91 |
| UDL-9 | Example 2-9 | 198 | 93 | Example 3-9 | 301 | 92 |
| UDL-10 | Example 2-10 | 199 | 92 | Example 3-10 | 300 | 92 |
| UDL-11 | Example 2-11 | 202 | 93 | Example 3-11 | 305 | 93 |
| UDL-12 | Example 2-12 | 200 | 91 | Example 3-12 | 299 | 92 |
| UDL-13 | Example 2-13 | 200 | 93 | Example 3-13 | 294 | 93 |
| UDL-14 | Example 2-14 | 202 | 94 | Example 3-14 | 294 | 93 |
| UDL-15 | Example 2-15 | 196 | 91 | Example 3-15 | 288 | 91 |
| UDL-16 | Example 2-16 | 200 | 92 | Example 3-16 | 298 | 93 |
| UDL-17 | Example 2-17 | 201 | 93 | Example 3-17 | 305 | 93 |
| UDL-18 | Example 2-18 | 200 | 91 | Example 3-18 | 300 | 92 |
| UDL-19 | Example 2-19 | 200 | 91 | Example 3-19 | 298 | 93 |
| UDL-20 | Example 2-20 | 202 | 92 | Example 3-20 | 305 | 93 |
| Comparative UDL-3 | Comparative Example 2-1 | 215 | 100 | Comparative Example 3-1 | 316 | 100 |

As shown in Table 4, in the results of Examples 3-1 to -20, where UDL-1 to -20 using the inventive compositions for forming an organic film were used, the film reduction amounts after the etching were small compared with Comparative Example 3-1, where a compound having no direct bond between fluorene skeletons was used, in both etching tests with $CF_4/CHF_3$-based gas and $O_2$-based gas. This indicates that films excellent in etching resistance were formed.

Example 4: Patterning Test 1 (Examples 4-1 to 4-20, Comparative Examples 4-1 to 4-3)

The compositions (UDL-1 to -20, comparative UDL-1 to -3) for forming an organic film were each applied onto a silicon wafer substrate and baked in the atmosphere at 350° C. for 60 seconds to form an organic film. SOG-1 was applied thereon and baked at 220° C. for 60 seconds to form a resist underlayer film having a film thickness of 35 nm. A monolayer resist for ArF, being a resist upper layer film material, was applied thereon and baked at 105° C. for 60 seconds to form a photoresist film having a film thickness of 100 nm. A liquid immersion top coat material (TC-1) was applied onto the photoresist film and baked at 90° C. for 60 seconds to form a top coat having a film thickness of 50 nm.

The resist upper layer film material (monolayer resist for ArF) was prepared by: dissolving a polymer (RP1), an acid generator (PAG1), and a basic compound (Amine1) in a solvent containing 0.1 mass % of surfactant FC-4430 (manufactured by Sumitomo 3M Ltd.) in the proportion shown in Table 5; and filtering the solution through a 0.1-μm filter made of a fluorinated resin.

TABLE 5

| | Polymer (parts by mass) | Acid generator (parts by mass) | Basic compound (parts by mass) | Solvent (parts by mass) |
|---|---|---|---|---|
| Monolayer resist for ArF | RP1 (100) | PAG1 (6.6) | Amine1 (0.8) | PGMEA (2500) |

The polymer (RP1), acid generator (PAG1), and basic compound (Amine1) used are shown below.

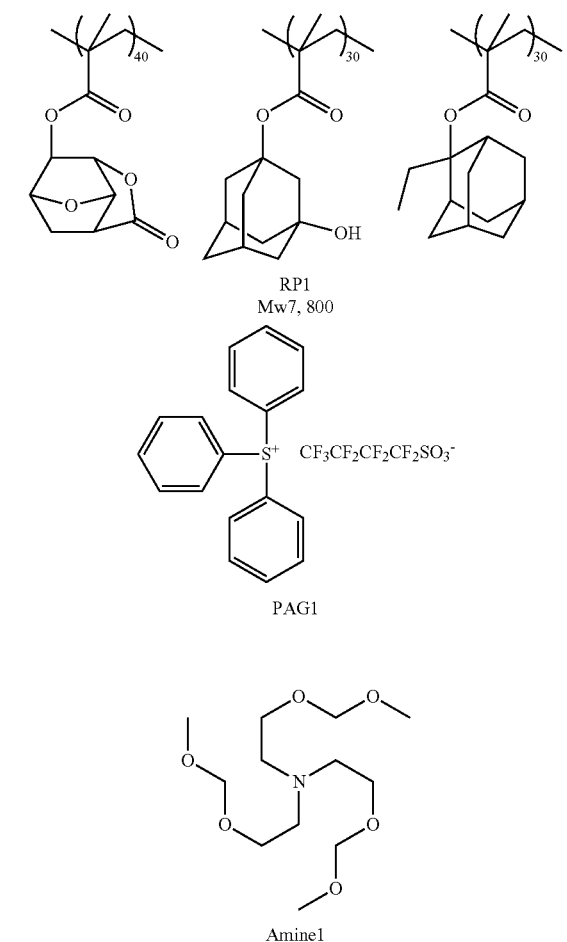

As the resist underlayer film material (SOG-1), a 2% solution of the following polymer in propylene glycol ethyl ether was prepared.

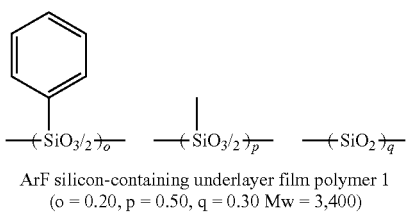

ArF silicon-containing underlayer film polymer 1
(o = 0.20, p = 0.50, q = 0.30 Mw = 3,400)

The liquid immersion top coat material (TC-1) was prepared by: dissolving a top coat polymer (PP1) into organic solvents in proportions shown in Table 6; and filtering the solution through a 0.1-μm filter made of a fluorinated resin.

TABLE 6

| | Polymer (parts by mass) | Organic solvent (parts by mass) |
|---|---|---|
| TC-1 | PP1 (100) | diisoamyl ether (2700) 2-methyl-1-butanol (270) |

The polymer (PP1) used is shown below.

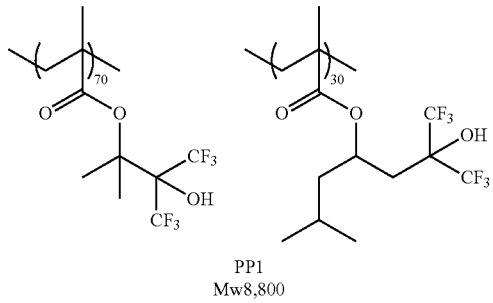 [SMILES: CCC(C)(C)C(=O)OC(C)(C)C(O)(C(F)(F)F)C(F)(F)F ; CCC(C)(C)C(=O)OC(CC(C)C)CC(O)(C(F)(F)F)C(F)(F)F]

PP1
Mw8,800

Next, the resulting substrate was exposed to light with an ArF liquid immersion exposure apparatus (NSR—S610C manufactured by Nikon Corporation, NA: 1.30, σ: 0.98/0.65, 35° s-polarized dipole illumination, 6% halftone phase shift mask), baked (PEB) at 100° C. for 60 seconds, and developed with a 2.38 mass % aqueous solution of tetramethylammonium hydroxide (TMAH) for 30 seconds. Thus, a positive line and space pattern of 45 nm to 25 nm was obtained.

Next, the SOG-1 was processed by dry etching while using the resist pattern as a mask with an etching apparatus Telius manufactured by Tokyo Electron Limited to form a hard mask pattern. The organic film was etched while using the obtained hard mask pattern as a mask to form an organic film pattern. The silicon wafer was processed by etching while using the obtained organic film pattern as a mask. The etching conditions were as described below.

Conditions for transferring the resist pattern to the SOG-1.
Chamber pressure: 10.0 Pa
RF power: 500 W
$CF_4$ gas flow rate: 150 sccm
$CHF_3$ gas flow rate: 50 sccm
Time: 15 sec
Conditions for transferring the SOG-1 pattern to the organic film.
Chamber pressure: 2.0 Pa
RF power: 1000 W
$N_2$ gas flow rate: 80 sccm
$CO_2$ gas flow rate: 200 sccm
CO gas flow rate: 100 sccm
Time: 60 sec
Conditions for transferring the organic film pattern to the silicon wafer.
Chamber pressure: 15.0 Pa
RF power: 500 W
$CF_4$ gas flow rate: 150 sccm
$CHF_3$ gas flow rate: 30 sccm
Time: 120 sec The pattern cross sections were observed with an electron microscope (S-4700) manufactured by Hitachi, Ltd. Table 7 shows the results.

TABLE 7

| | Composition for forming organic film | Pattern profile after etching for transferring to substrate | Minimum dimension without pattern twisting after etching for transferring to substrate |
|---|---|---|---|
| Example 4-1 | UDL-1 | vertical profile | 34 |
| Example 4-2 | UDL-2 | vertical profile | 31 |
| Example 4-3 | UDL-3 | vertical profile | 31 |
| Example 4-4 | UDL-4 | vertical profile | 31 |
| Example 4-5 | UDL-5 | vertical profile | 33 |
| Example 4-6 | UDL-6 | vertical profile | 31 |
| Example 4-7 | UDL-7 | vertical profile | 33 |
| Example 4-8 | UDL-8 | vertical profile | 32 |
| Example 4-9 | UDL-9 | vertical profile | 31 |
| Example 4-10 | UDL-10 | vertical profile | 33 |
| Example 4-11 | UDL-11 | vertical profile | 32 |
| Example 4-12 | UDL-12 | vertical profile | 31 |
| Example 4-13 | UDL-13 | vertical profile | 29 |
| Example 4-14 | UDL-14 | vertical profile | 30 |
| Example 4-15 | UDL-15 | vertical profile | 31 |
| Example 4-16 | UDL-16 | vertical profile | 33 |
| Example 4-17 | UDL-17 | vertical profile | 33 |
| Example 4-18 | UDL-18 | vertical profile | 29 |
| Example 4-19 | UDL-19 | vertical profile | 34 |
| Example 4-20 | UDL-20 | vertical profile | 32 |
| Comparative Example 4-1 | Comparative UDL-1 | pattern collapse | — |
| Comparative Example 4-2 | Comparative UDL-2 | vertical profile | 34 |
| Comparative Example 4-3 | Comparative UDL-3 | vertical profile | 41 |

As shown in Table 7, as a result of any of Examples 4-1 to 4-20 where the inventive compositions (UDL-1 to -20) for forming an organic film were used, the resist upper layer film pattern was favorably transferred to the substrate in the end, confirming that the inventive compositions for forming an organic film are suitably used in fine processing according to the multilayer resist method. On the other hand, in Comparative Example 4-1, the curing was insufficient as shown by the solvent resistance test, and therefore, pattern collapse occurred at patterning, and it was not possible to obtain a favorable pattern. In Comparative Examples 4-2 and -3, patterns were formed. However, in Comparative Example 4-3, where a compound having no direct bond between fluorene skeletons was used, the minimum dimension without pattern twisting after etching for transferring to the substrate was larger than in Examples 4-1 to 4-20.

Example 5: Patterning Test 2 (Examples 5-1 to 5-20, Comparative Example 5-1 to 5-3)

Laminated films were formed by the same methods as those in patterning test 1, except that the compositions (UDL-1 to -20, comparative UDL-1 to -3) for forming an organic film were each applied onto a SiO$_2$ wafer substrate having a trench pattern (trench width: 10 μm, trench depth: 0.10 μm) and baked in the atmosphere at 350° C. for 60 seconds. Then, the laminated films were subjected to patterning and dry etching, and the resulting pattern profiles were observed. The following Table 8 shows the results.

TABLE 8

| | Composition for forming organic film | Pattern profile after etching for transferring to substrate | Minimum dimension without pattern twisting after etching for transferring to substrate |
|---|---|---|---|
| Example 5-1 | UDL-1 | vertical profile | 35 |
| Example 5-2 | UDL-2 | vertical profile | 33 |
| Example 5-3 | UDL-3 | vertical profile | 31 |
| Example 5-4 | UDL-4 | vertical profile | 31 |
| Example 5-5 | UDL-5 | vertical profile | 33 |
| Example 5-6 | UDL-6 | vertical profile | 32 |
| Example 5-7 | UDL-7 | vertical profile | 33 |
| Example 5-8 | UDL-8 | vertical profile | 32 |
| Example 5-9 | UDL-9 | vertical profile | 31 |
| Example 5-10 | UDL-10 | vertical profile | 32 |
| Example 5-11 | UDL-11 | vertical profile | 31 |
| Example 5-12 | UDL-12 | vertical profile | 31 |
| Example 5-13 | UDL-13 | vertical profile | 29 |
| Example 5-14 | UDL-14 | vertical profile | 30 |
| Example 5-15 | UDL-15 | vertical profile | 31 |
| Example 5-16 | UDL-16 | vertical profile | 34 |
| Example 5-17 | UDL-17 | vertical profile | 33 |
| Example 5-18 | UDL-18 | vertical profile | 29 |
| Example 5-19 | UDL-19 | vertical profile | 34 |
| Example 5-20 | UDL-20 | vertical profile | 33 |
| Comparative Example 5-1 | Comparative UDL-1 | pattern collapse | — |
| Comparative Example 5-2 | Comparative UDL-2 | pattern collapse | — |
| Comparative Example 5-3 | Comparative UDL-3 | vertical profile | 42 |

As shown in Table 8, as a result of any of the inventive compositions for forming an organic film (Examples 5-1 to 5-20), the resist upper layer film pattern was favorably transferred to the substrate in the end, confirming that the inventive compositions for forming an organic film are suitably used in fine processing according to the multilayer resist method. On the other hand, in Comparative Example 5-2, although solvent resistance was achieved and a cured film was obtained, pattern collapse occurred at patterning since the pattern was poorly filled, and a favorable pattern was not obtained in the end. In Comparative Example 5-1, as in Comparative Example 4-1 in patterning test 1, the curing was insufficient as shown by the solvent resistance test, and therefore, pattern collapse occurred at patterning, and it was not possible to obtain a favorable pattern. In Comparative Example 5-3, a pattern was formed, but the minimum dimension without pattern twisting after etching for transferring to the substrate was larger than in Examples 5-1 to 5-20.

Example 6: Defect Inspection (Examples 6-1 to 6-20, Comparative Example 6-1

The compositions (UDL-1 to -20, comparative UDL-2) for forming an organic film were each applied onto a silicon wafer substrate and baked in the atmosphere at 350° C. for 60 seconds. Then, the surface of the formed organic film was measured for coating defects with a size of 60 nm or more with a dark-field defect inspection system SP2 manufactured by KLA-Tencor Corporation.

TABLE 9

| | Composition for forming organic film | Coating defects |
|---|---|---|
| Example 6-1 | UDL-1 | 8 |
| Example 6-2 | UDL-2 | 12 |
| Example 6-3 | UDL-3 | 10 |
| Example 6-4 | UDL-4 | 9 |
| Example 6-5 | UDL-5 | 14 |
| Example 6-6 | UDL-6 | 13 |
| Example 6-7 | UDL-7 | 20 |
| Example 6-8 | UDL-8 | 25 |
| Example 6-9 | UDL-9 | 21 |
| Example 6-10 | UDL-10 | 9 |
| Example 6-11 | UDL-11 | 11 |
| Example 6-12 | UDL-12 | 13 |
| Example 6-13 | UDL-13 | 9 |
| Example 6-14 | UDL-14 | 8 |
| Example 6-15 | UDL-15 | 10 |
| Example 6-16 | UDL-16 | 13 |
| Example 6-17 | UDL-17 | 12 |
| Example 6-18 | UDL-18 | 11 |
| Example 6-19 | UDL-19 | 14 |
| Example 6-20 | UDL-20 | 10 |
| Comparative Example 6-1 | Comparative UDL-2 | 78 |

As shown in Table 9, the number of coating defects after forming the organic film was smaller in each of the Examples 6-1 to 6-20 where the inventive UDL-1 to UDL-20 were used than in Comparative Example 6-1, indicating that the number of defects was suppressed. It can be conjectured that this is because the solvent solubility of the compounds (polymers) used in Examples 6-1 to 6-20 is high, so that insoluble components are hardly generated, and generation of coating defects was suppressed. On the other hand, it can be conjectured that the polymer R1 used in Comparative Example 6-1 had two polymerization points in the carbon atom in the top position of the fluorene skeleton, and therefore, solvent solubility was low and a large amount of insoluble components was generated, so that a comparatively large number of coating defects were generated.

Note that the solvent solubility tested in the defect inspection was to test the solubility of the polymer in the compositions to an organic solvent. On the other hand, it should be noted that the solvent resistance shown in Table 3 is the solvent resistance of the organic films obtained by applying each composition onto a substrate and baking the coating films, and is different from the solubility of the polymer to the organic solvent tested in the defect inspection.

As described above, it has been made clear that the inventive coating-type composition for forming an organic film containing the inventive polymer for forming an organic film has favorable dry etching resistance, and also has high filling and planarizing properties, and is therefore extremely useful as an organic film material used in a multilayer resist method. In addition, the inventive patterning process using this compositions allows precise formation of a fine pattern even when the body to be processed is a stepped substrate. Furthermore, it has been made clear that the generation of defects can be suppressed since solvent solubility is high.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A coating-type composition for forming an organic film comprising: a polymer having a partial structure shown by the following general formula (2); and an organic solvent,

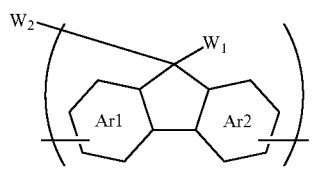

wherein in the formula (2), ring structures Ar1 and Ar2 represent a benzene ring or a naphthalene ring optionally having a substituent, $W_1$ represents an aryl group having 6 to 30 carbon atoms and optionally having a substituent, $W_2$ represents an organic group, the organic group having a structure selected from the group consisting of

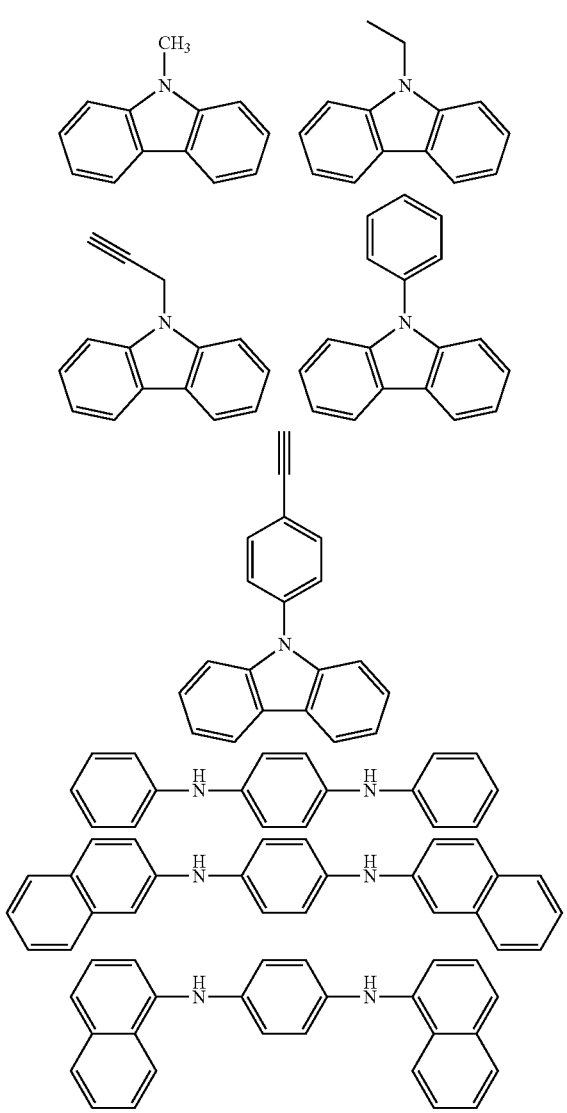

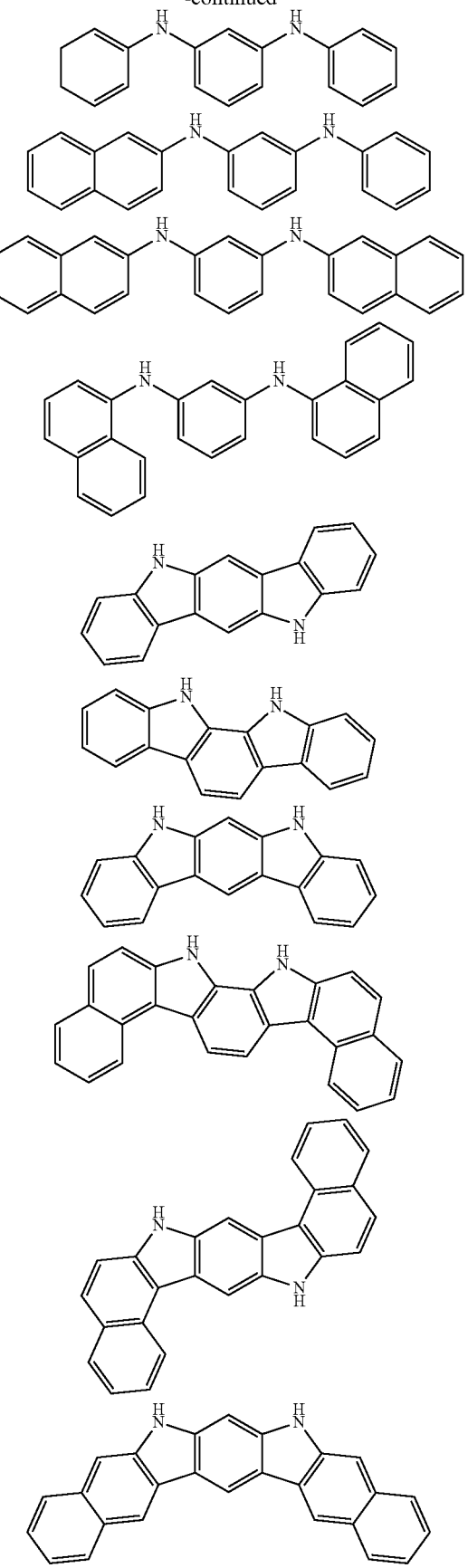

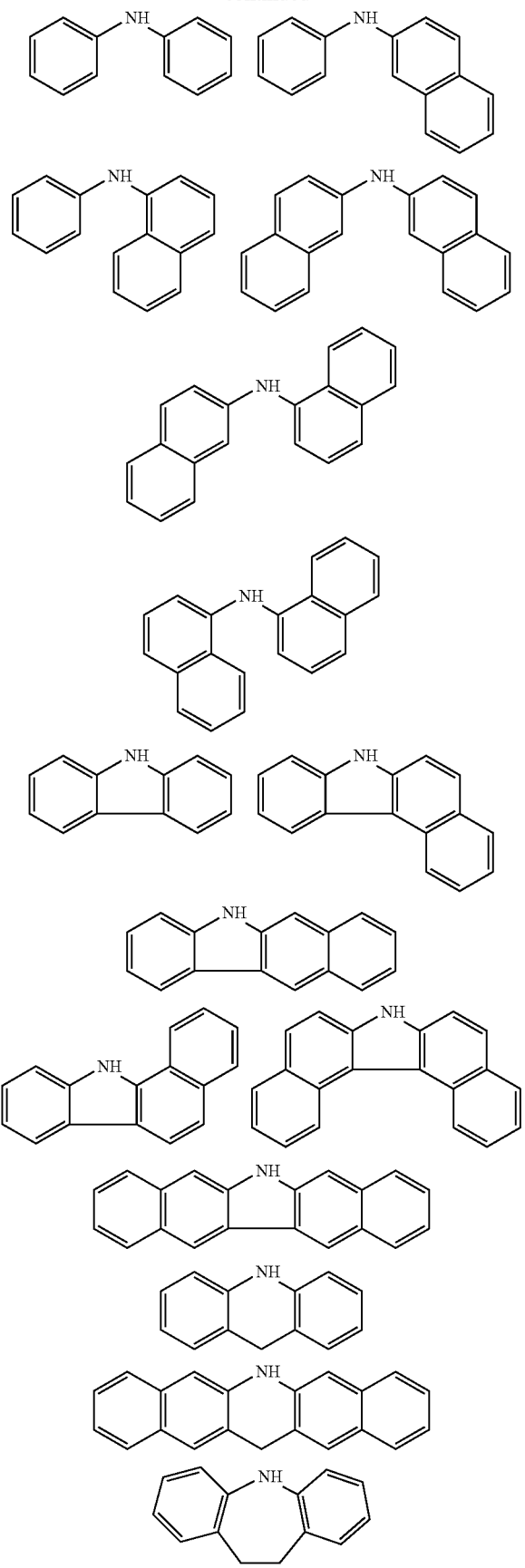
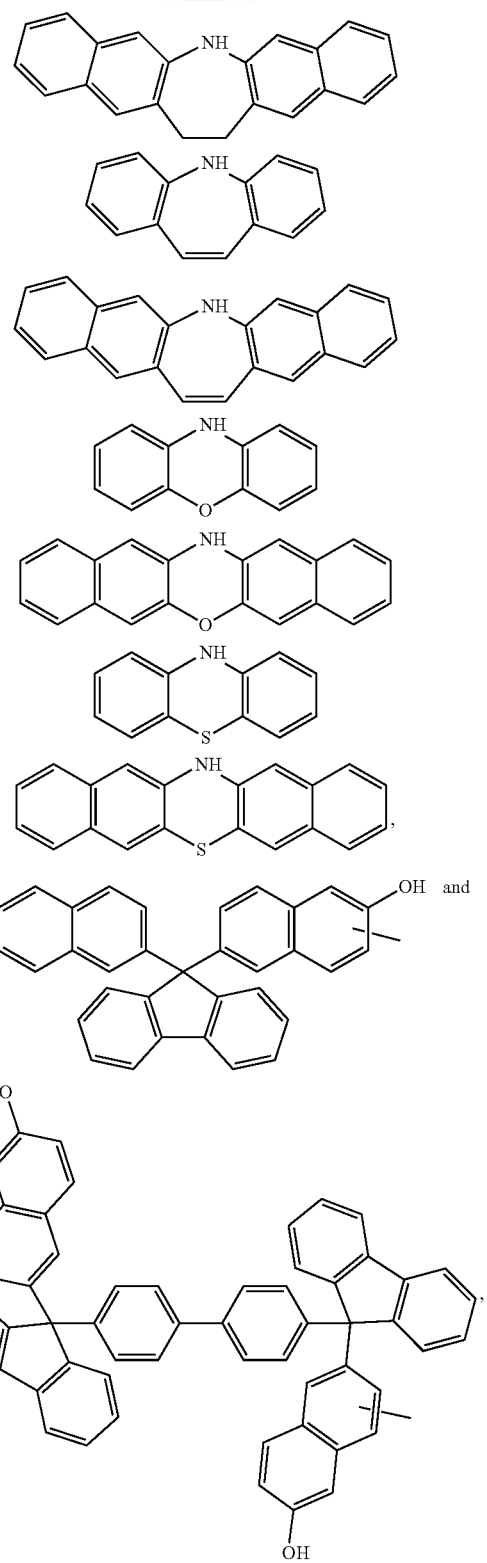
W$_2$ is optionally crosslinked to another repeating unit.
2. The coating-type composition for forming an organic film according to claim 1, wherein the polymer further comprises a partial structure shown by the following general formula (3),

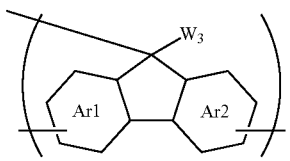

(3)

wherein in the formula (3), ring structures Ar1 and Ar2 are the above ring structures Ar1 and Ar2, and $W_3$ represents a hydrogen atom.

3. The coating-type composition for forming an organic film according to claim 1, wherein the polymer has a weight-average molecular weight of 500 to 5000.

4. The coating-type composition for forming an organic film according to claim 1, wherein the organic solvent is a mixture of one or more organic solvents each having a boiling point of lower than 160° C. and one or more organic solvents each having a boiling point of 160° C. or higher.

5. The coating-type composition for forming an organic film according to claim 1, further comprising at least one of an acid generator, a crosslinking agent, a surfactant, and a plasticizer.

6. A patterning process comprising:
forming an organic film by using the coating-type composition for forming an organic film according to claim 1, on a body to be processed;
forming a silicon-containing resist underlayer film by using a silicon-containing resist underlayer film material on the organic film;
forming a resist upper layer film by using a photoresist composition on the silicon-containing resist underlayer film;
forming a circuit pattern in the resist upper layer film;
transferring the pattern to the silicon-containing resist underlayer film by etching the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

7. A patterning process comprising:
forming an organic film by using the coating-type composition for forming an organic film according to claim 1 on a body to be processed;
forming a silicon-containing resist underlayer film by using a silicon-containing resist underlayer film material on the organic film;
forming an organic antireflective coating on the silicon-containing resist underlayer film;
forming a resist upper layer film by using a photoresist composition on the organic antireflective coating so that a 4-layered film structure is constructed;
forming a circuit pattern in the resist upper layer film;
transferring the pattern to the organic antireflective coating and the silicon-containing resist underlayer film by etching the organic antireflective coating and the silicon-containing resist underlayer film while using the resist upper layer film having the formed pattern as a mask;
transferring the pattern to the organic film by etching the organic film while using the silicon-containing resist underlayer film having the transferred pattern as a mask; and
further forming the pattern on the body to be processed by etching the body to be processed while using the organic film having the transferred pattern as a mask.

8. A patterning process comprising:
forming an organic film by using the coating-type composition for forming an organic film according to claim 1 on a body to be processed;
forming an inorganic hard mask selected from a silicon oxide film, a silicon nitride film, and a silicon oxynitride film on the organic film;
forming a resist upper layer film by using a photoresist composition on the inorganic hard mask;
forming a circuit pattern in the resist upper layer film;
transferring the pattern to the inorganic hard mask by etching the inorganic hard mask while using the resist upper layer film having the formed pattern as a mask;
transferring the pattern to the organic film by etching the organic film while using the inorganic hard mask having the transferred pattern as a mask; and
further forming the pattern on the body to be processed by etching the body to be processed while using the organic film having the transferred pattern as a mask.

9. A patterning process comprising:
forming an organic film by using the coating-type composition for forming an organic film according to claim 1 on a body to be processed;
forming an inorganic hard mask selected from a silicon oxide film, a silicon nitride film, and a silicon oxynitride film on the organic film;
forming an organic antireflective coating on the inorganic hard mask;
forming a resist upper layer film by using a photoresist composition on the organic antireflective coating, so that a 4-layered film structure is constructed;
forming a circuit pattern in the resist upper layer film;
transferring the pattern to the organic antireflective coating and the inorganic hard mask by etching the organic antireflective coating and the inorganic hard mask while using the resist upper layer film having the formed pattern as a mask;
transferring the pattern to the organic film by etching the organic film while using the inorganic hard mask having the formed pattern as a mask; and
further forming the pattern on the body to be processed by etching the body to be processed while using the organic film having the formed pattern as a mask.

10. The patterning process according to claim 9, wherein the inorganic hard mask is formed by a CVD method or an ALD method.

11. The patterning process according to claim 6, wherein the pattern formation on the resist upper layer film is performed by a photolithography using light with a wavelength of 10 nm or more to 300 nm or less, a direct drawing by electron beam, a nanoimprinting, or a combination thereof.

12. The patterning process according to claim 6, wherein the pattern formation on the resist upper layer film comprises alkaline development or development with an organic solvent.

13. The patterning process according to claim 6, wherein the body to be processed is a semiconductor device substrate, a metal film, a metal carbide film, a metal oxide film, a metal nitride film, a metal oxycarbide film, or a metal oxynitride film.

14. The patterning process according to claim 6, wherein the body to be processed comprises silicon, titanium, tungsten, hafnium, zirconium, chromium, germanium, copper, silver, gold, aluminum, indium, gallium, arsenic, palladium, iron, tantalum, iridium, molybdenum, or an alloy thereof.

15. A polymer having a partial structure shown by the following general formula (2),

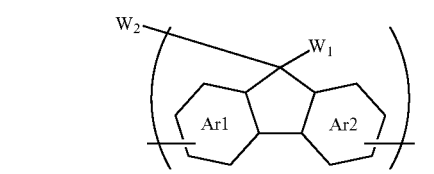

wherein in the formula (2), ring structures Ar1 and Ar2 represent a benzene ring or a naphthalene ring optionally having a substituent, $W_1$ represents an aryl group having 6 to 30 carbon atoms and optionally having a substituent, $W_2$ represents an organic group, the organic group having a structure selected from the group consisting of

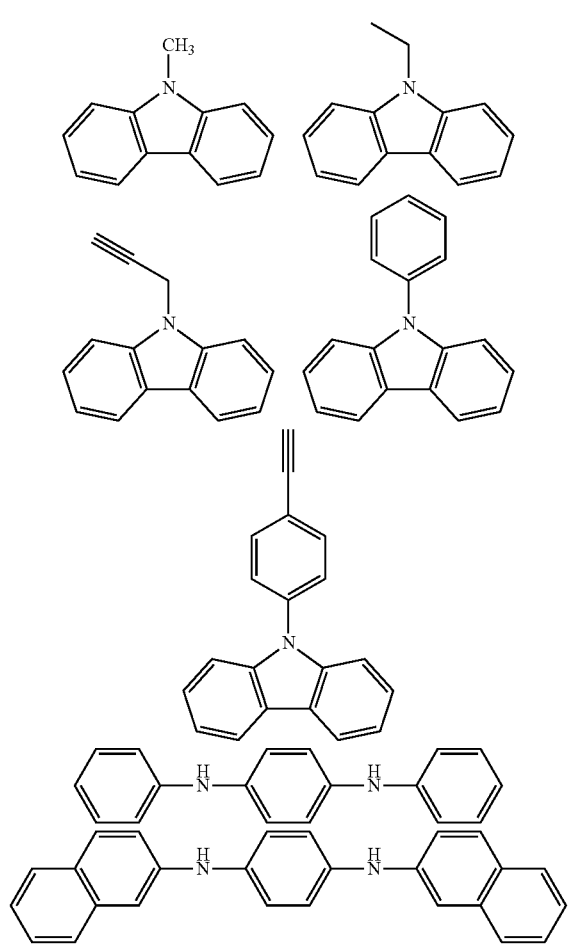

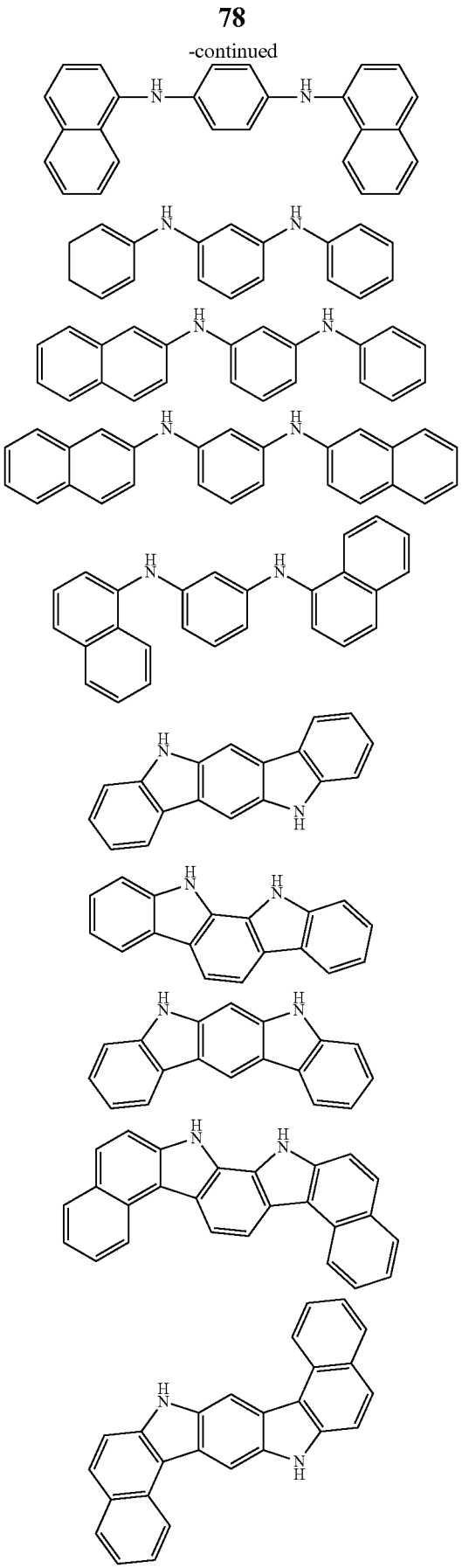

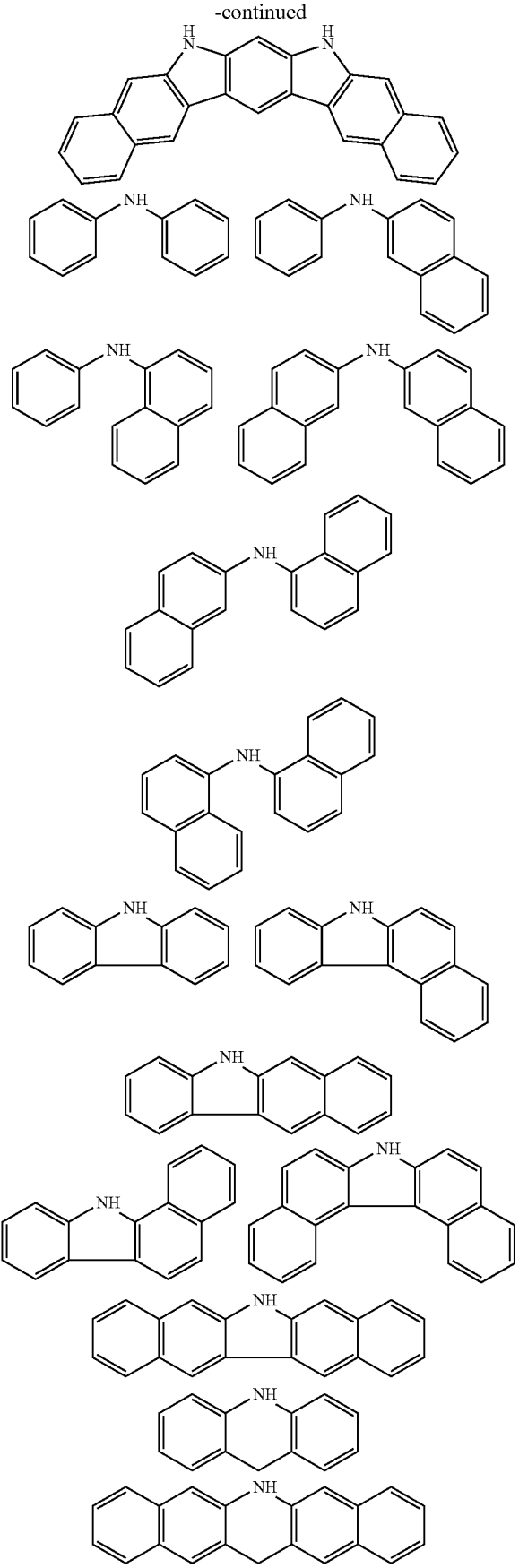
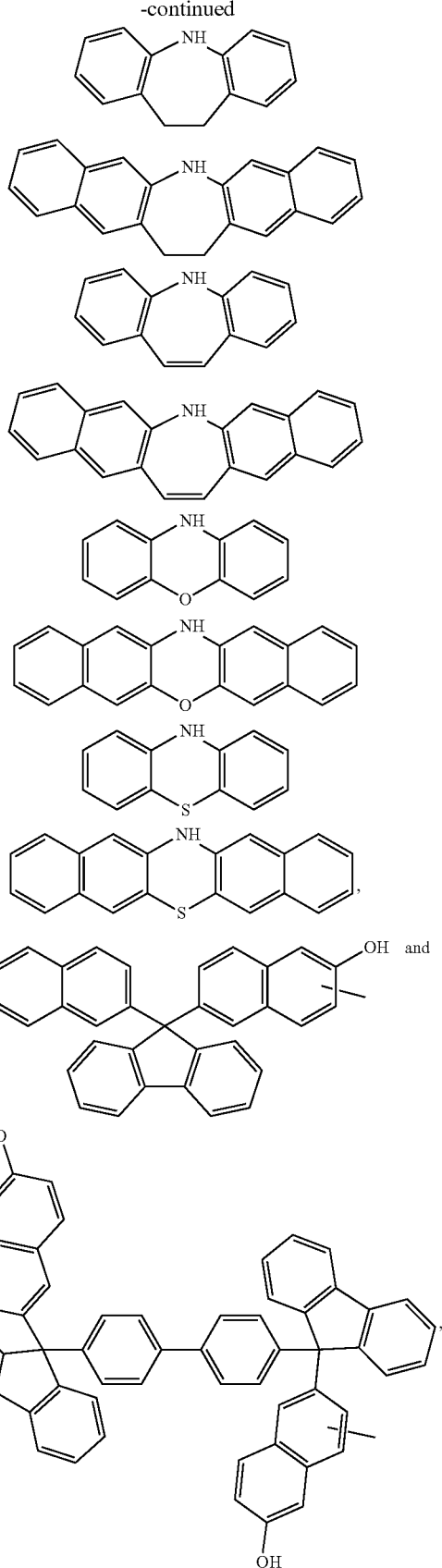
W₂ is optionally crosslinked to another repeating unit.

16. The polymer according to claim 15, further comprising a partial structure shown by the following general formula (3),

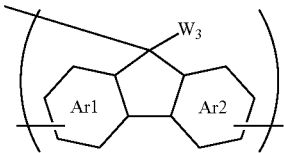

(3)

wherein in the formula (3), ring structures Ar1 and Ar2 are the above ring structures Ar1 and Ar2, and $W_3$ represents a hydrogen atom.

17. The polymer according to claim 15, having a weight-average molecular weight of 500 to 5000.

18. A method for manufacturing the polymer according to claim 15, wherein the $W_2$ represents the organic group, and the polymer is synthesized by copolymerizing a fluorenol having the aryl group $W_1$ and a tertiary alcohol group and a compound having the organic group $W_2$ as a partial structure.

19. A method for manufacturing the polymer according to claim 15, wherein the $W_2$ represents the organic group, the polymer is synthesized by an electrophilic substitution reaction to a fluorene ring accompanied by dehydration while using a fluorenol having the aryl group $W_1$ and a tertiary alcohol group as a monomer, and a compound having the organic group $W_2$ as a partial structure is added during the synthesizing of the polymer.

20. A method for manufacturing the polymer according to claim 16, wherein a fluorenol having the aryl group $W_1$ and a tertiary alcohol group and a fluorenol having a secondary alcohol group are copolymerized.

21. A method for manufacturing the polymer according to claim 16, wherein the polymer is synthesized by an electrophilic substitution reaction to a fluorene ring accompanied by dehydration while using one of a first fluorenol having the aryl group $W_1$ and a tertiary alcohol group or a second fluorenol having a secondary alcohol group as a monomer to obtain a first polymer, and another of the first fluorenol and the second fluorenol is added to the first polymer and further polymerized to obtain the polymer according to claim 20 as a second polymer.

* * * * *